United States Patent
Kitagaki

(10) Patent No.: US 9,692,299 B2
(45) Date of Patent: Jun. 27, 2017

(54) VOLTAGE-CURRENT CHARACTERISTIC GENERATOR

(71) Applicant: Keysight Technologies, Inc., Minneapolis, MN (US)

(72) Inventor: Takashi Kitagaki, Loveland, CO (US)

(73) Assignee: Keysight Technologies, Inc., Santa Rosa, CA (US)

( * ) Notice: Subject to any disclaimer, the term of this patent is extended or adjusted under 35 U.S.C. 154(b) by 448 days.

(21) Appl. No.: 14/043,653

(22) Filed: Oct. 1, 2013

(65) Prior Publication Data

US 2014/0117970 A1 May 1, 2014

(30) Foreign Application Priority Data

Oct. 31, 2012 (JP) .................................. 2012-241066

(51) Int. Cl.
| | |
|---|---|
| *H02M 3/158* | (2006.01) |
| *H02J 1/10* | (2006.01) |
| *G01R 31/28* | (2006.01) |
| *G01R 31/36* | (2006.01) |

(52) U.S. Cl.
CPC ........ *H02M 3/158* (2013.01); *G01R 31/2841* (2013.01); *G01R 31/2848* (2013.01); *H02J 1/10* (2013.01); *G01R 31/36* (2013.01); *Y10T 307/696* (2015.04)

(58) Field of Classification Search
CPC ....... H02M 1/4258; H02M 2001/0032; H02M 2001/0009
See application file for complete search history.

(56) References Cited

U.S. PATENT DOCUMENTS

| | | | |
|---|---|---|---|
| 5,579,236 A | 11/1996 | Tamamura et al. | |
| 5,708,379 A | 1/1998 | Yosinski | |
| 7,872,481 B1 * | 1/2011 | Goeke ............... | G01R 31/2889 324/750.01 |

(Continued)

FOREIGN PATENT DOCUMENTS

| | | |
|---|---|---|
| JP | 08262069 A | 10/1996 |
| JP | 2010-151592 | 7/2010 |
| JP | 2014-177399 | 9/2014 |

OTHER PUBLICATIONS

Office Action dated Aug. 19, 2016 in Japanese Application No. 2012-241066 (Unofficial/non-certified English language translation provided by foreign agent included).

(Continued)

*Primary Examiner* — Timothy J Dole
*Assistant Examiner* — Yusef Ahmed

(57) ABSTRACT

Disclosed is a voltage-current characteristic generator that includes: a voltage source; a current source; a selector for selecting and outputting the output of either the voltage source or the current source; a sensing portion, connected to an output of the selector, for outputting the output of the selector and for sensing, and feeding back, the voltage and current of the output; and a controller for receiving the voltage and current detected by the sensing portion and for setting the subsequent outputs in the voltage source and the current source, wherein, in addition to setting the subsequent outputs, the controller evaluates an operating mode wherein the subsequent output from the selector is to be from either the voltage source or the current source.

20 Claims, 18 Drawing Sheets

(56) References Cited

U.S. PATENT DOCUMENTS

| | | | | |
|---|---|---|---|---|
| 8,279,631 B2* | 10/2012 | Yang | H02J 7/0072 | |
| | | | 363/20 | |
| 2005/0073859 A1* | 4/2005 | Fukumoto | H02M 1/32 | |
| | | | 363/16 | |
| 2005/0162143 A1* | 7/2005 | Fukumoto | H02M 1/4225 | |
| | | | 323/284 | |
| 2007/0035284 A1* | 2/2007 | Schoofs et al. | H02M 3/1584 | |
| | | | 323/283 | |
| 2008/0030220 A1* | 2/2008 | Agarwal | G01R 31/2884 | |
| | | | 324/762.09 | |
| 2009/0001954 A1* | 1/2009 | Morota | H02M 3/33507 | |
| | | | 323/282 | |
| 2009/0058383 A1* | 3/2009 | Ryoo | H02M 3/156 | |
| | | | 323/282 | |
| 2009/0206814 A1* | 8/2009 | Zhang | H02M 3/33507 | |
| | | | 323/284 | |
| 2009/0284237 A1* | 11/2009 | Kitagawa | H02M 3/156 | |
| | | | 323/282 | |
| 2010/0060364 A1* | 3/2010 | Lin | H03K 4/501 | |
| | | | 331/17 | |
| 2010/0164446 A1* | 7/2010 | Matsuo | H02M 3/158 | |
| | | | 323/282 | |
| 2010/0165666 A1* | 7/2010 | Wang | H02M 3/33523 | |
| | | | 363/21.01 | |
| 2010/0208500 A1* | 8/2010 | Yan | H02M 3/33523 | |
| | | | 363/21.12 | |
| 2010/0237840 A1* | 9/2010 | Walter | H02J 7/0068 | |
| | | | 323/282 | |
| 2010/0301821 A1* | 12/2010 | Kung | H02M 3/33523 | |
| | | | 323/283 | |
| 2011/0115456 A1* | 5/2011 | Tanifuji | H02M 3/156 | |
| | | | 323/283 | |
| 2011/0157936 A1* | 6/2011 | Huynh | H02M 3/33507 | |
| | | | 363/78 | |
| 2011/0169471 A1* | 7/2011 | Nagasawa | H02M 3/1584 | |
| | | | 323/283 | |
| 2011/0193733 A1* | 8/2011 | Kuramochi | H03M 1/1061 | |
| | | | 341/144 | |
| 2011/0261596 A1* | 10/2011 | Zong | H02M 3/33507 | |
| | | | 363/21.13 | |
| 2012/0075891 A1* | 3/2012 | Zhang | H02M 3/335 | |
| | | | 363/21.18 | |
| 2012/0187968 A1* | 7/2012 | Hashimoto | G01R 31/2839 | |
| | | | 324/750.01 | |
| 2012/0194141 A1* | 8/2012 | Shi | H02J 7/0073 | |
| | | | 320/137 | |
| 2012/0201063 A1* | 8/2012 | Sugawara | H02M 1/4225 | |
| | | | 363/89 | |
| 2012/0262961 A1* | 10/2012 | Chien | H02M 3/33507 | |
| | | | 363/84 | |
| 2013/0250629 A1* | 9/2013 | Xu | H02M 3/33523 | |
| | | | 363/21.17 | |
| 2013/0257298 A1* | 10/2013 | Cheon | H05B 37/02 | |
| | | | 315/185 R | |
| 2013/0294118 A1* | 11/2013 | So | H02M 3/33507 | |
| | | | 363/21.16 | |
| 2013/0308350 A1* | 11/2013 | Huang | H02M 3/33523 | |
| | | | 363/21.16 | |
| 2014/0009081 A1* | 1/2014 | Fujiwara | H02M 1/08 | |
| | | | 315/224 | |
| 2014/0036548 A1* | 2/2014 | YANG; TA-YUNG | H02M 3/335 | |
| | | | 363/21.07 | |
| 2014/0071714 A1* | 3/2014 | Li | H02M 3/33507 | |
| | | | 363/16 | |
| 2014/0132236 A1* | 5/2014 | Darmawaskita | H02M 3/156 | |
| | | | 323/283 | |
| 2015/0067358 A1* | 3/2015 | Philbrick | H02M 3/158 | |
| | | | 713/300 | |

OTHER PUBLICATIONS

English abstract of JP2014-177399, published Sep. 25, 2014.

* cited by examiner

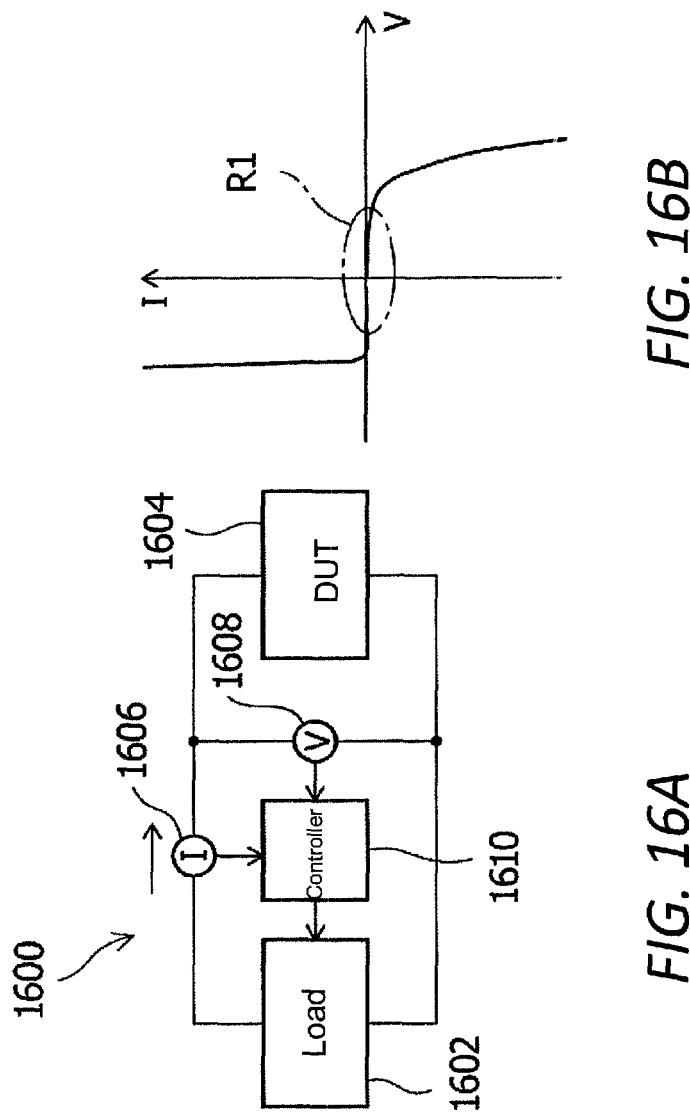

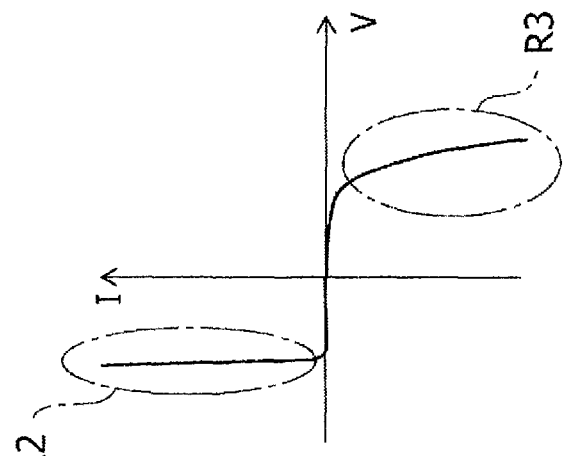
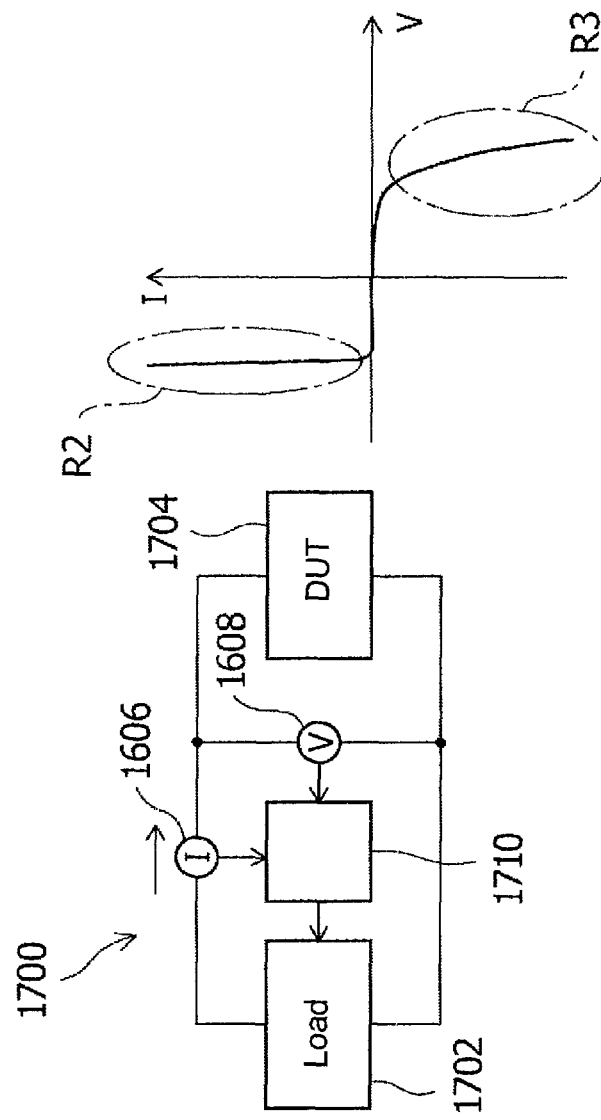

VOLTAGE-CURRENT CHARACTERISTIC GENERATOR

REFERENCE TO RELATED APPLICATIONS

The application claims the benefit of foreign priority to Japanese Patent Application Number 2012-241066, filed on Oct. 31, 2012, to inventor Takashi Kitagaki.

BACKGROUND OF THE INVENTION

1. Field of the Invention

The invention relates in general to a voltage-current characteristic generator, and, in particular, to a voltage-current characteristic generator able to emulate voltage-current characteristics of an electric and/or electronic device, such as a battery or a semiconductor, connected to a device being measured such as an electronic device or a power supply.

2. Related Art

There is the need for a device to perform emulation of voltage-current characteristics of electric and/or electronic devices. For example, if there were a device that emulates the characteristics of a desired light-emitting diode element in order to confirm the operation of an LED driver that supplies power to a light-emitting diode element that is used for light-emitting diode illumination, the LED driver could be designed and manufactured efficiently. Moreover, if there were a device that emulates the voltage-current characteristics of a rechargeable battery, which changes depending on the operating time and environment, then it would be possible to design and manufacture mobile electronic devices efficiently. A voltage-current characteristic emulating device is disclosed in Japanese Unexamined Patent Application Publication 2010-151592 ("JP '592 reference") as an attempt to provide an electronic load device or load emulating device that is a portion of the functions of a device for emulating such voltage-current characteristics.

The JP '592 reference describes achieving the diode characteristics set forth in FIG. 2 thereof through a voltage source or current source. However, when an electronic load 1602, which uses a voltage source, is connected to a device under test (DUT) 1604, which has a low output impedance, in the circuit 1600, as shown in FIG. 16A, the operation of the electronic load 1602 may become unstable in regions, such as region R1 in FIG. 16B, wherein the absolute value of the slope of the voltage-current curve is low, and thus cannot provide the desired characteristics to the DUT 1604 (such as, for example, an LED driver) because the voltage-current values are not stable. In this example, the electronic load 1602 is controlled by a controlling portion 1610 through feedback so as to apply the desired voltage and current to the DUT 1604 based on the voltage value applied to the DUT 1604 (as read out from a voltmeter 1608) and the current value that flows in the DUT 1604 (as read out from an ammeter 1606).

Moreover, when an electronic load 1702, which uses a current source, is connected to a DUT 1704, which has a high output impedance, in the circuit 1700 as shown in FIG. 17A, the operation of the electronic load 1702 becomes unstable in regions, such as regions R2 and R3 in FIG. 17B. In this example, the absolute value of the slope of the voltage-current curve is large, and thus cannot provide the desired characteristics to the DUT 1704 (such as, for example, an LED driver) because the voltage-current values are not stable. In this example, the electronic load 1702 is controlled by a controlling portion 1710 through feedback so as to apply the desired voltage and current to the DUT 1704 based on the voltage value applied to the DUT 1704 (as read out from a voltmeter 1708) and the current value that flows in the DUT 1704 (as read out from an ammeter 1706).

In these examples, the diode characteristics in FIG. 16B and FIG. 17B show the diode characteristics when viewed from the electronic loads 1602 and 1702, and because the electric currents that flows in from the outside are represented by negative values, they are in a form that has been inverted in the up/down direction from that of the graph in FIG. 2 of the JP '592 reference. The other characteristic graphs in the specification are shown in the same way.

In Japanese Unexamined Patent Application Publication H08-262069 ("JP '069 reference") a voltage-current characteristic measuring device that can be used as a high precision voltage source or current source is disclosed. This circuit is assumed to be used as a voltage source or current source for a load in a region wherein stabilized operation is possible.

As such, the known prior art does not go beyond achieving emulation of voltage-current characteristics in regions that are limited in advance and slopes that are limited in advance. Therefore there is a need for a system that overcomes the problems stated above.

SUMMARY

Disclosed is a system that enables the provision of a voltage-current characteristic generator, equipped with a voltage source and a current source, wherein, through switching between the voltage source and the current source, it is possible to output using the current source when the output using the voltage source would be unstable, and possible to output using the voltage source when the output using the current source would be unstable.

Moreover, the disclosed system enables the provision of a voltage-current characteristic generator able to achieve low resistance characteristics from low negative resistance values (for example, −1 kΩ) to values that are infinitely close to positive low resistance values.

The disclosed system is able to provide a voltage-current characteristic generator able to emulate characteristics possessed by natural curves in all four quadrants that appear on the voltage-current perpendicular axes.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The invention can be better understood by referring to the following figures. The components in the figures are not necessarily to scale, emphasis instead being placed upon illustrating the principles of the invention. In the figures, like reference numerals designate corresponding parts throughout the different views.

FIG. 16A is black diagram of an example of an implementation of a circuit for emulating LED characteristics using an electronic load using a voltage source according to the present invention.

FIG. 16B is a graph illustrating measurement results thereof.

FIG. 17A is an example of an implementation of a circuit for emulating LED characteristics using an electronic load using a current source according to the present invention.

FIG. 17B is a graph illustrating measurement results thereof.

DETAILED DESCRIPTION OF THE INVENTION

Figure 1:
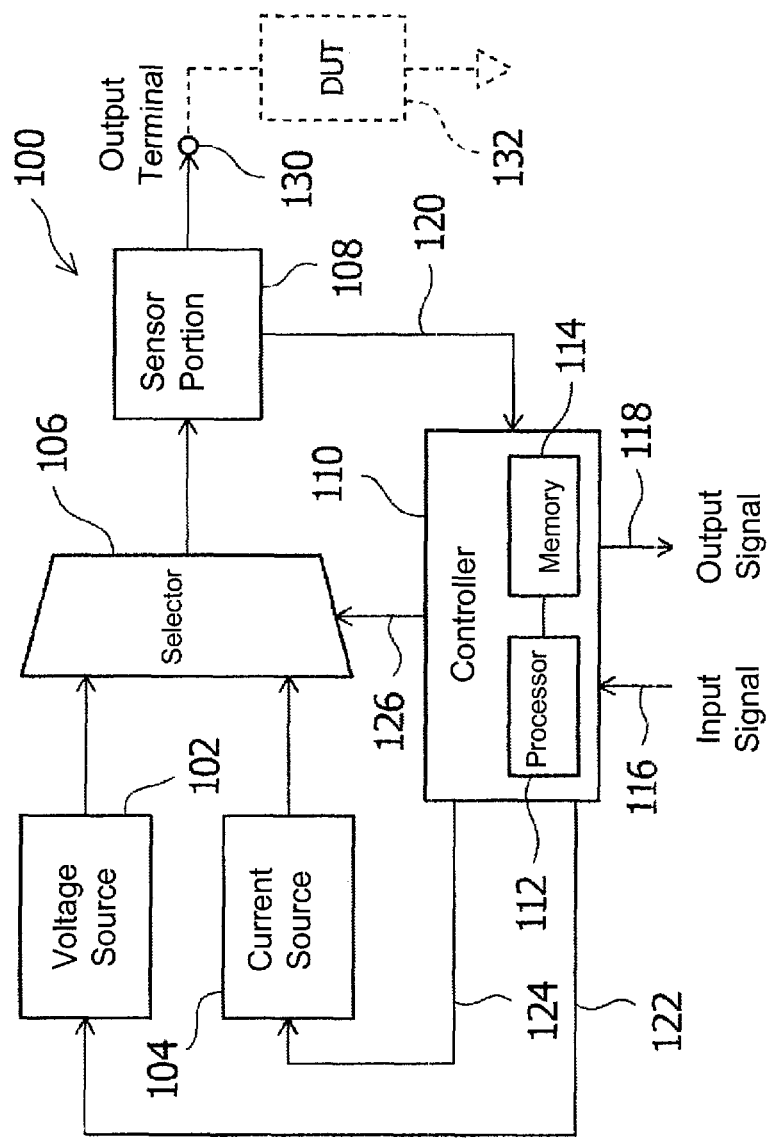
FIG. 1 is a block diagram of an example of an implementation of a voltage-current characteristic generator according to the present invention.

Disclosed is a system that enables the provision of a voltage-current characteristic generator, equipped with a voltage source and a current source, wherein, through switching between the voltage source and the current source, it is possible to output using the current source when the output using the voltage source would be unstable, and possible to output using the voltage source when the output using the current source would be unstable.

Moreover, the disclosed system enables the provision of a voltage-current characteristic generator able to achieve low resistance characteristics from low negative resistance values (for example, −1 kΩ) to values that are infinitely close to positive low resistance values.

The disclosed system is able to provide a voltage-current characteristic generator able to emulate characteristics possessed by natural curves in all four quadrants that appear on the voltage-current perpendicular axes.

In general, disclosed is a voltage-current characteristic generator that includes: a voltage source; a current source; a selector for selecting and outputting the output of either the voltage source or the current source; a sensing portion, connected to an output of the selector, for outputting the output of the selector and for sensing, and feeding back, the voltage and current of the output; and a controller for receiving the voltage and current detected by the sensing portion and for setting the subsequent outputs in the voltage source and the current source, wherein, in addition to setting the subsequent outputs, the controller evaluates an operating mode wherein the subsequent output from the selector is to be from either the voltage source or the current source.

Moreover, the voltage-current characteristic generator may also include: a first error amplifier; a second error amplifier; a selector for selecting and outputting the output of either the first error amplifier or the second error amplifier; a power amplifier, connected to the output of the selector, for amplifying a signal; a sensing portion for outputting the output of the power amplifier and for sensing, and feeding back to the second error amplifier, the current of the output; a voltage sensing point for outputting the output of the current sensor and for sensing, and feeding back to the first error amplifier, the voltage of the output; and a controller for receiving the feedback from the current sensor and feedback from the voltage sensing point, and for outputting the settings for the subsequent outputs in the first error amplifier and the second error amplifier, wherein, in addition to setting the subsequent outputs, the controller evaluates an operating mode wherein the subsequent output from the selector is to be from either the first error amplifier or the second error amplifier.

In an example of an implementation the controller may further include an external parameter input and an external output is included, a form wherein the selector receives, from the controller, a control signal for selecting either the voltage source or the current source is included, a form wherein the selector is a comparing device is included, a form wherein the selector is an adding device is included, a form wherein the controller controls the setting of either the voltage source or the current source depending on the result of the evaluation of whether the subsequent output from the selector is to be from the voltage source or from the current source is included, and a form wherein the controller is able to output an output that is swept in either operating mode is included.

Additionally, as another example, the controller may be provided with data or a program for specifying an operating mode for a plurality of output settings, for evaluating the operating mode for the setting for the subsequent output is included, a form wherein the data or program comprises data or a program for specifying an operating mode based on an external parameter input in addition to a plurality of output settings is included, a form wherein the settings for the plurality of outputs in the data include data based on a measurement result by the voltage-current characteristic generator is included, a form wherein the controller is structured so as to measure a present voltage and electric current, to calculate a subsequent voltage and electric current, to evaluate, from the subsequent voltage and electric current, an operating mode to be selected, and to control to that operating mode is included, a form wherein the controller, when calculating the subsequent voltage and electric current, further receives an input from an external input parameter input and performs a calculation is included, a form wherein the controller is structured so as to measure a present voltage and current, to calculate a resistance value of a DUT that is connected to the voltage-current generator, from a variation in the measured values for the present voltage and electric current, to compare with an output resistance value at the present voltage and current, calculated from a plurality of output settings provided by the controller, to evaluate an operating mode to be selected, based on the subsequent voltage and electric current, and to control to the operating mode is included, a form wherein the operating mode evaluation by the controller selects a voltage supply mode if the output resistance value is greater than the resistance value of the DUT, and selects a current supply mode otherwise is included, and a form wherein the controller includes, in the subsequent output settings, a plurality of settings wherein a signal that includes an AC component is superimposed is included.

Additionally, the controller is able to generate hysteresis characteristics, backlash characteristics, Gunn diode characteristics, saturation characteristics, dead zone characteristics, or Coulomb friction or viscous friction model characteristics is included, a form wherein the controller is provided with a memory effect unit for calculating memory effect characteristics based on basic characteristics, in order to generate any of said characteristics is included, a form wherein the controller is able to generate either a transient response or AC characteristics is included, and a form wherein the controller is provided with a processor and a memory is included.

Moreover, a device for generating characteristics of a device provided with three or more terminals may be provided with first and second voltage characteristic generators as set forth in any of the forms above. Furthermore, the aforementioned device for generating the aforementioned characteristics may include a configuration wherein an external output of the first voltage-current characteristic generator is connected to an external parameter input of the second voltage-current characteristic generator, and generates characteristics of a device.

The problem described earlier may be analyzed as follows. First the relationships between the voltage source, the voltage source output impedance, and the internal voltage source and internal resistance in the DUT that is an LED driver, in the circuit illustrated in FIG. 16A can be represented as the equivalent circuit 700 as illustrated in FIG. 7A.

That is, the voltage source 702, along with outputting the voltage $V_F$, is provided with an output resistance $R_{series}$ 704, and the LED driver 710, which is the DUT, is provided with an internal voltage source 714 and internal resistance $R_L$ 712, where the voltage $V_L$ that is applied to the LED driver 710 is measured by a voltmeter 706, and fed back to the voltage source 702 to correct the voltage $V_F$. Moreover, the current flowing in the LED driver 710 is measured by an ammeter 705. As shown by the dotted line, here the output impedance, when looking at the voltage source 702 side from the LED driver 710 is the impedance $Z_{out}$.

Figure 7A:
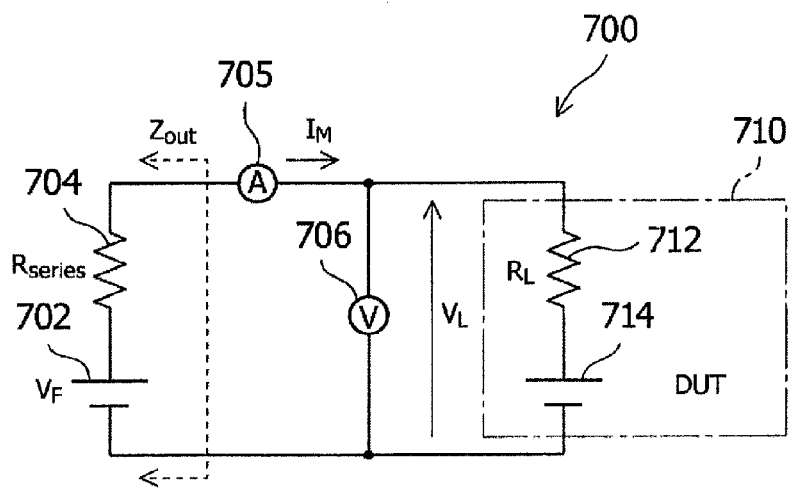
FIG. 7A is a block diagram for explaining the relationship between the output impedance and the DUT internal resistance in a circuit that emulates LED characteristics using an electronic load that uses a voltage source according to the present invention.
Figure 7B:
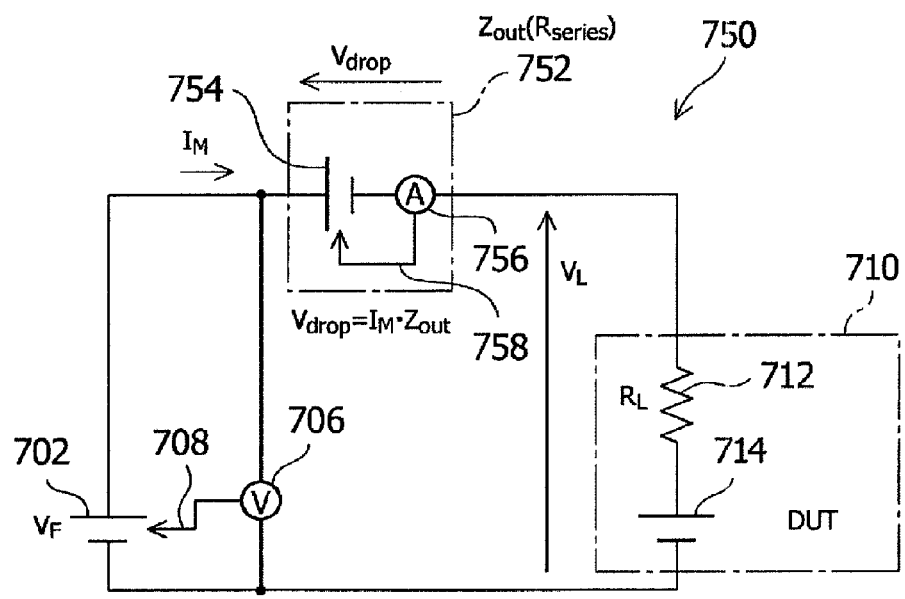
FIG. 7B is a block diagram for explaining the control of the voltage and current in the circuit in FIG. 7A according to the present invention.

FIG. 7B is a diagram for explaining the voltage and current control of the circuit in FIG. 7A. Here, in FIG. 7B, the output impedance $Z_{out}$ is expressed as an output resistance $R_{series}$ 752 that is inserted in series between the voltage source 702 and the LED driver 710. Moreover, for the output impedance $Z_{out}$ to express the current control operation of the voltage source 702, the configuration is provided with a voltage source 754 wherein a voltage $V_{drop}$ is controlled, through electric current feedback 758 from the ammeter 756, so that the voltage drop of the output impedance $Z_{out}$ will be the desired value $I_M$ times $Z_{out}$. Consequently, the circuit 700 in FIG. 7A is expressed as the circuit 750 in FIG. 7B.

If here the current that flows in the circuit 750 is defined as $I_M$, and the voltage of the internal voltage source 714 is defined as $V_{DUT\_internal}$, the voltage across the terminals of the DUT 710, that is, the voltage $V_L$ is expressed by the following equation:

$$V_L = I_M \cdot R_L + V_{DUT\_INTERNAL} \qquad (1).$$

Moreover, the voltage $V_{drop}$ across the output resistance $Z_{out}$ 752 is expressed by the following equation:

$$V_{drop} = I_M \cdot Z_{out} \qquad (2).$$

It is appreciated by those skilled in the art that because the slope is $dI/dV = 1/Z_{out}$ in a region wherein the absolute value of the slope is small, such as the region R1 in the graph in FIG. 16B, this indicates that the output resistance $Z_{out}$ is large. When, at this time, the current $I_M$ changes by $dI_M$, the change in the voltage $V_F$ due to the output resistance $Z_{out}$, that is, the change $dV_{F\_drop}$ in the voltage $V_F$ due to the change $V_{drop}$ will be, by Equation (2):

$$dV_{F\_drop} = dI_M \cdot Z_{out}.$$

Moreover, the change in the voltage $V_F$ due to the internal resistance $R_L$, that is, the change $dV_{F\_RL}$ of the voltage $V_F$ due to the change $V_L$, by Equation (1) will be:

$$dV_{F\_RL} = dI_M \cdot R_L,$$

and thus the ratio of the changes in the voltage $V_{F\_drop}$ and $V_{F\_RL}$ is expressed by the following equation:

$$dV_{F\_drop}/dV_{F\_RL} = Z_{out}/R_L \qquad (3).$$

Here, as described above, $Z_{out}$ is a large value in the region R1. Moreover, if the internal resistance $R_L$ of the DUT takes a value that is less than $Z_{out}$, then $dV_{F\_drop}/dV_{F\_}{}^{RF}>1$, and thus, in FIG. 7B, even if $V_F$ is changed to control $V_L$, the change in $V_{drop}$ will be larger than the change in $V_L$, causing the operation of the circuit 750 to become unstable. Given the above, the circuit 750 will be unstable when $Z_{out}>R_L$.

Figure 18A:
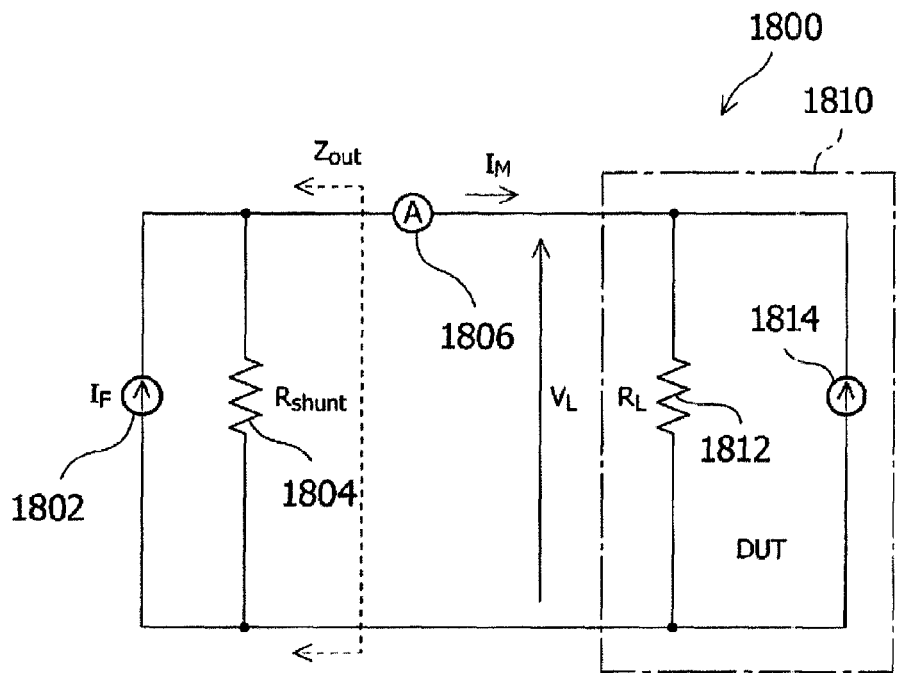
FIG. 18A is a block diagram of an example of an implementation of a system for explaining the relationship between the output impedance and the load resistance in a circuit for emulating LED characteristics, using an electronic load that uses a current source according to the present invention.

Next the relationships between the current source, the current source output resistance, and the internal current source and internal resistance in the DUT 1704 that is an LED driver, in the case of the circuit illustrated in FIG. 17A can be represented as the equivalent circuit 1800 as illustrated in FIG. 18A. That is, the current source 1802, along with outputting the current $I_F$, is provided with an output resistance $Z_{out}$ ($R_{shunt}$) 1804, and the LED driver 1810, which is the DUT, is provided with an internal current source 1814 and internal resistance $R_L$ 1812, where the current $I_M$ that is applied to the LED driver 1810 is measured by a ammeter 1806, and fed back to the current source 1802 to correct the output current $I_F$. As shown by the dotted line, here the output impedance, when looking at the current source 1802 side from the LED driver 1810 is the impedance $Z_{out}$.

Figure 18B:
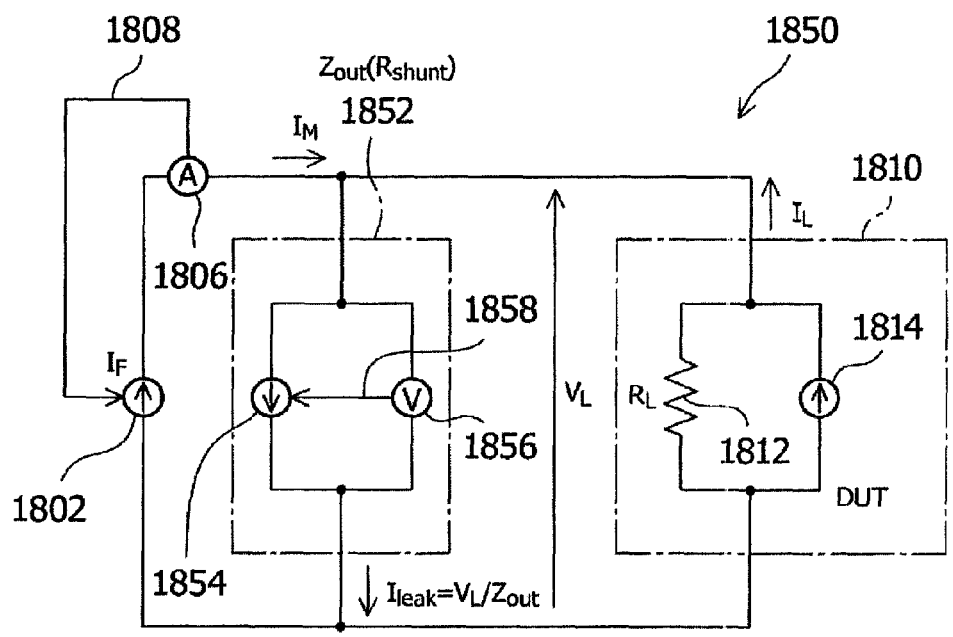
FIG. 18B is a block diagram for an example of an implementation of another system explaining the control of the voltage and current in the circuit in FIG. 18A according to the present invention.

FIG. 18B is a diagram for explaining the voltage and current control of the circuit in FIG. 18A. Here, in FIG. 18B, the output impedance $Z_{out}$ is expressed as an output resistance $Z_{out}$ ($R_{shunt}$) 1852 that is inserted in parallel between the current source 1802 and the DUT 1810. Moreover, for the output impedance $Z_{out}$ ($R_{shunt}$) 1852 to express the current control operation of the current source 1802, the configuration is provided with a current source 1854 wherein a current $I_{leak}$ is controlled, through electric voltage feedback 1858 from the voltmeter 1856, to be a desired value. Consequently, the circuit 1800 in FIG. 18A is expressed as the circuit 1850 in FIG. 18B.

If here the current that flows in the circuit 1850 is defined as $I_M$, the voltage $V_L$ across the terminals of the DUT 1810 is expressed by Equation (1), above, and, additionally, the current $I_{leak}$ that flows in the output resistance $Z_{out}$ 1852 is expressed by the following equation:

$$I_{leak}=V_L/Z_{out} \quad (4).$$

It is appreciated that because the slope in a region wherein the absolute value of the slope is large, such as the regions R2 and R3 in the graph in FIG. 17B, the slope indicates $1/Z_{out}$, so this indicates that the output resistance $Z_{out}$ is small. When, at this time, the voltage $V_L$ changes by $dV_L$, the change in the current $I_F$ due to the output resistance $Z_{out}$, that is, the change $I_{F\_leak}$ in the current $I_F$ due to the change $I_{leak}$ will be, by Equation (4):

$$dI_{leak}=dV_L/Z_{out} \quad (4).$$

Moreover, the change in the current $I_F$ due to the internal resistance $R_L$ of the DUT that is, the change $dI_{F\_RL}$ of the current $I_F$ due to the change $I_L$, will be:

$$dI_{F\_RL}=dV_L/R_L,$$

and thus the ratio of the changes in the current $I_{F\_leak}$ and the current $I_{F\_RL}$ is expressed by the following equation:

$$dI_{F\_leak}/dI_{F\_RL}=R_L/Z_{out} \quad (5).$$

Here, as described above, $Z_{out}$ is a small value in the region R2 and R3. If the internal resistance $R_L$ of the DUT takes a value that is more than $Z_{out}$, then $dI_{F\_drop}/dI_{F\_RL}>1$, and thus, in FIG. 18B, even if $I_F$ is changed to control $I_L$, the change in $I_{leak}$ will be larger than the change in $I_L$, causing the operation of the circuit 1850 to become unstable.

Given the above, the circuit 1850 will be unstable when $Z_{out}<R_L$.

While, in the discussion above, in practice the current sensor resistance, the inventor discovered that the parallel capacitance of the current sensor portion, the interconnection resistance, the interconnection capacitance, and the load capacitance also have an effect on the stability, in most cases the relationship between the output resistance and the internal resistance of the DUT, as described above, dominates.

It is appreciated that while in the circuit set forth above it is possible to delay entering into the unstable state and delay oscillation through limiting the band of the feedback circuit, in such cases the circuit complexity is increased and the response speed is sacrificed. Even if it were possible to achieve characteristics such in FIG. 16B or FIG. 17B through applying such constraints, this is not mean that it would be possible to accommodate all types of DUT characteristics, but rather there would always be these limitations.

Given this, the inventor arrived at the concept of a voltage-current characteristic generator able to output through selecting a voltage source or a current source with appropriate magnitudes for the output resistance and the DUT internal resistance, or in other words, a voltage-current characteristic generator able to use the current source to compensate for the region wherein the output by the voltage source would be unstable, and able use the voltage source to compensate for the region wherein the output of the current source would be unstable.

A voltage-current characteristic generator 100 that is a first embodiment according to the present invention is illustrated in FIG. 1. Note that in the present specification, be aware that when the "voltage source mode" is used, this indicates an operating mode where the power supply operates as a voltage source, and the term "current source mode" indicates an operating mode for the power supply where the power supply operates as a current source.

The voltage-current characteristic generator 100 is provided with a voltage source 102 and a current source 104, where the output of either the voltage source 102 or the current source 104 is selected by a selector 106 and outputted to a sensor portion 108. Here the voltage source 102 is a power supply that operates as a voltage source for outputting, with high precision, an output voltage that has been set, and is able to output voltages of a variety of values depending on the setting. Here the current source 104 is a power supply that operates as a current source for outputting, with high precision, an output current that has been set, and is able to output currents of a variety of values depending on the setting.

Moreover, the sensor portion 108 outputs the output from the selector to the output terminal 130, as the output of the voltage-current characteristic generator 100, and also senses or detects the voltage and current in the output signal, and sends them through a path 122 the controller 110. The controller 110, based on the input from the sensor portion 108, sends a control signal to the voltage source 102 through a path 122, and sends a control signal to the current source 104 through a path 124. Note that the DUT is connected to the output terminal 130.

The controller 110 is provided, internally, with a processor 112 and a memory 114 that is connected to the processor, and is provided with the ability to perform calculations. The controller 110 is provided with a terminal to which an input signal 116 for an external parameter is connected, to be able to read in the parameter from the outside and use it in calculations. Moreover, the controller 110 is provided with a terminal that is connected to an external output signal 118, to enable signals and data from within the controller 110 to be outputted from the controller.

The selector 106 operates so as to select, and output, either the signal from the voltage source 102 or the signal from the current source 104, depending on the control signal from the path 124 from the controller 110.

A commercially available processor, a combination processor, an ASIC (Application Specific Integrated Circuit), a PLD (Programmable Logic Device), or an FPGA (Field-Programmable Gate Array) may be used for the processor 112, although there is no limitation thereto.

A ROM (Read-Only Memory), an EPROM (Erasable Programmable Read-Only Memory), an EEPROM (Electrically Erasable Programmable Read-Only Memory), a RAM (Random Access Memory), a flash memory, or another non-volatile memory or volatile memory may be included in the memory 114, but there is no limitation thereto. A program that is executed by the processor 112, and data used by said program, can be stored in the memory 114.

For the signals that are read in from the path 120 by the controller 110 and outputted to the path 122 or 124, analog transmission or digital transmission of the signal from the path 120, or transmission as a signal that electrically passes through the controller 110 are included. Furthermore, the controller 110 can output, to the selector 126, through the path 126, the control signal for operating the selector 106. Moreover, the controller 110 may be provided with a write/read signal line to the memory 114, enabling access to the memory 114 from the outside, by a computer, or the like.

As one example, the controller 110 controls the voltage source 102 through the path 122 so as to maintain a voltage that has been set by a voltage sensor signal or voltage sensor value from the path 120, to make it possible to perform settings by sending, to the voltage source 102, through the path 122, the next voltage setting value, taking into consideration the amount of voltage drop due to the output resistance $Z_{out}$ within the voltage source 102, depending on the electric current sensor signal or the electric current sensor value.

Similarly, the controller 110 controls the current source 104 through the path 124 so as to maintain a current that has been set by a current sensor signal or current sensor value from the path 120, to make it possible to perform settings by sending, to the current source 104, through the path 124, the next current setting value, taking into consideration the amount of leakage current due to the output resistance $Z_{out}$ within the current source 104, depending on the voltage sensor signal or the voltage current sensor value.

The operation of the controller 110 will be explained in reference to the flow chart 800 and FIG. 8. First the relationship between the output voltage V and the output current I in the voltage-current characteristic generator 100 (that is, the relationship between the voltage that is sensed and the current that is sensed by the sensor portion) can be expressed using the function F(x) and the inverse function $F^{-1}(x)$ as:

$$I=F(V) \text{ and}$$

$$V=F^{-1}(I).$$

First, in Step 802, the controller 110 measures the voltage $V_N$ and the current $I_N$ at the present operating point. This can be performed through measuring the signal from the path 120 from the sensing portion. Next, the voltage $V_{N+1}$ and the current $I_{N+1}$ at the next operating point is calculated by calculating $$V_{N+1}=F^{-1}(I_N)$$

$$I_{N+1}=F(V_N)$$

in Step 804.

Following this, in Step 806 an evaluation is made as to whether the voltage $V_{N+1}$ and the current $I_{N+1}$ in the next operating point are within the region for the current source mode. If the evaluation result in Step 806 is YES, processing advances to Step 808, and the current source mode is selected as the operating mode of the voltage-current characteristic generator 100, and the current $I_{N+1}$ is outputted to the current source 104 through the path 124 as the setting current value, and processing returns to Step 802. On the other hand, if the evaluation result in Step 806 is NO, then processing advances to Step 810, where the voltage source mode is selected as the operating mode for the voltage-current characteristic generator 100, and the voltage $V_{N+1}$ is outputted to the current source 104 through the path 124 as the setting voltage value, and processing returns to Step 802.

In Step 806, the region evaluation as to which operating point is in which operating mode can be performed through loading, into the memory 114, data or a program for evaluating the region, through data, such as a table, or a program, or the like, in advance.

If performing the region set up using a table, then, as in Table 1, described below, the voltage/current value for an operating point of the voltage-current characteristic generator 100, in relation to the DUT, can use a table that incorporates a curve of operating points, that is, discrete data indicating an operating curve, and for each individual combination of voltage-current values, can include, at the very least, values indicating the voltage or current mode that should be selected at that time.

It is appreciated that while the operating points are indicated in the table as discrete values, evaluations of regions between the discrete values can be made through interpolation using various different types of interpolation methods, such as PWL (Piecewise Linear Interpolation), spline interpolation, or the like, on these discrete values.

If performing the region evaluation using a program, then various methods may be used such as loading the region evaluation program for the DUT that is to be evaluated into the memory 114, or preparing libraries in the memory 114 for each type of region evaluation, or loading required region data into separate memories 114.

The operation of the controller 110 from FIG. 8 will be explained further in reference to FIG. 9. In the case of FIG. 9, the operating curve outputted by the voltage-current characteristic generator 100 for generating or emulating the voltage-current characteristics of a battery, as one example, is shown by curve 902, in the voltage-current graph of FIG. 9. The point 904 on the operating curve is the point wherein $Z_{out}=R_L$, and is the transition point wherein the output of the voltage-current characteristic generator 100 should be switched from the current source mode to the voltage source mode or switched from the voltage source mode to the current source mode.

The evaluation of the region for the voltage source mode/current source mode first divides the current-voltage characteristics into the regions 906 through 912 of the four quadrants, centered on the transition point 904. The table or program is set up so as to indicate the operating mode that is determined by placing the present operating point in Step 802 and the next operating point in Step 804 so as to always be on the curve 902, and determining depending on the side of the transition point 904 where the next operating point is.

In consideration of FIG. 7, the table or program is constructed so that here, in the operating curve of FIG. 9, the voltage is less than the transition point, then the absolute value of the slope of the graph is small, and thus the current source mode is indicated for stable operation, but if the voltage is higher than the transition point, then the absolute value of the slope of the graph is large, and the voltage source mode is indicated.

Moreover, the operating mode for the next operating point may be determined as follows in a case wherein the measured point (the present operating point) or the next operating point is not on the operating curve due to noise, transient conditions, or the like.

If the measured points are Meas1, Meas2, Meas3, Meas4, and Meas5, illustrated in FIG. 9, then, from the slope of the operating curve 902, if, for the measured point, the voltage is less than the transition point in the current is greater than the transition point (region 906), then the operation will be in the current source mode, where, conversely, if the voltage is greater and the current is less (region 912), then the operation will be in the voltage source mode.

In the case wherein the measured point is in region 910 or 908 opened (Meas5 or Meas3), the voltage source mode or the current source mode is used, and the operating point is moved into region 906 or 912. At this point, preferably control (voltage source mode or current source mode) on the side that is further separated (with the greater distance) from the transition point is used, so as to enable rapid convergence. The distance in this case is a value that is normalized by the time required for convergence, for that is further depending on the time.

It is appreciated that an operating method may be used wherein, if the current operating point is in region 908 or 910, then the transition point 904 may be used as the next operating point.

Figure 10:
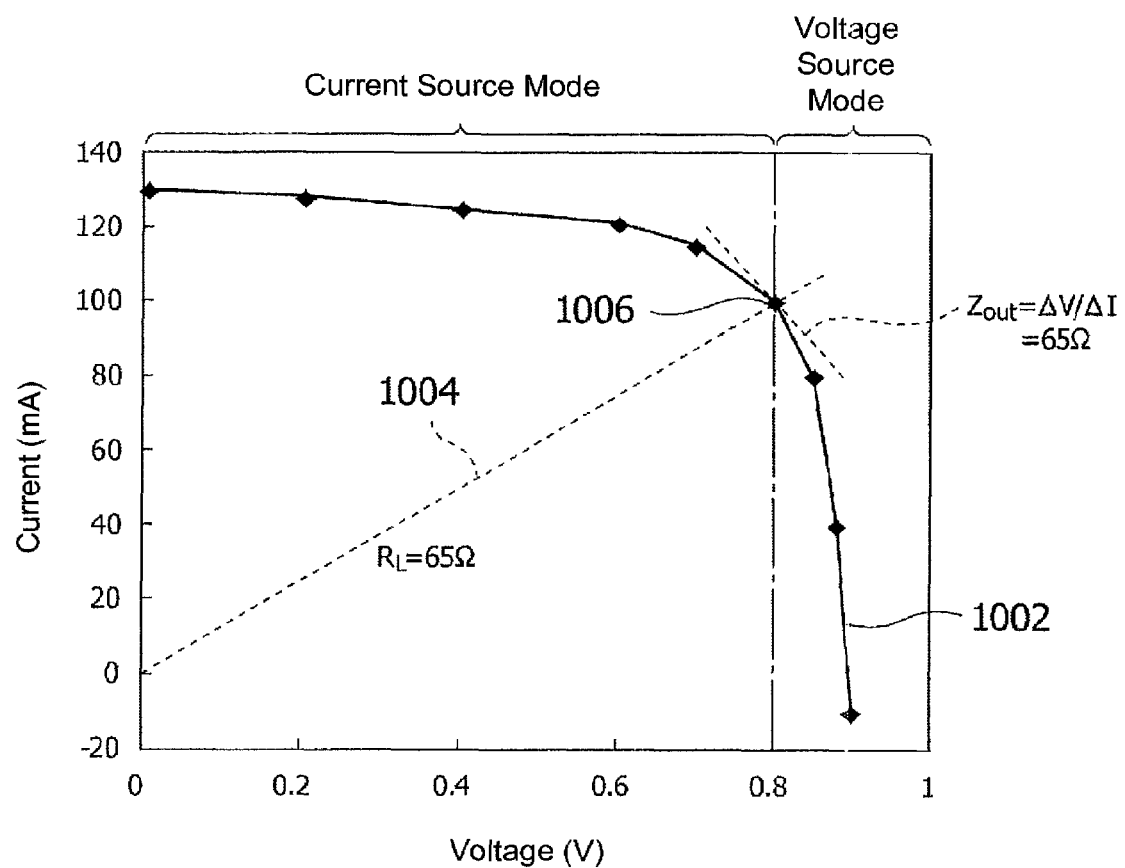
FIG. 10 is a plot of an example of a voltage-current characteristic for explaining the assignment of operating modes using the voltage-current characteristics of a solar cell as an example according to the present invention.

An example wherein the operating modes for the case wherein the operating curve is that of a solar cell, such as illustrated in FIG. 10, are shown in a table will be described next. Referencing FIG. 10, here the slope of the tangent at each operating point of the operating curve 1002 is expressed by $Z_{out}$ at that operating point, where the intersection of the operating curve 1002 and the load resistance line 1004 that indicates the internal resistance characteristics of the DUT, that is, the point wherein $Z_{out}=R_L$, is the transition point 1006 wherein, in the operating mode, the current source mode and the voltage source mode should be switched, where, as illustrated in FIG. 10, the assignment of the voltage source mode and the current source mode using the transition point 1006 can be understood from the thinking regarding FIG. 7. The operating modes that are specified using the table in this case are expressed as in Table 1.

TABLE 1

Operating Modes for the Case of a Solar Cell

| Voltage (V) | Current (mA) | V/I Mode |
|---|---|---|
| 0.00 | 130 | I |
| 0.20 | 128 | I |
| 0.40 | 125 | I |
| 0.60 | 121 | I |
| 0.70 | 115 | I |
| 0.80 | 100 | V |

TABLE 1-continued

Operating Modes for the Case of a Solar Cell

| Voltage (V) | Current (mA) | V/I Mode |
|---|---|---|
| 0.85 | 80 | V |
| 0.88 | 40 | V |
| 0.90 | −10 | |

Here the "V/I Mode" column is a column for specifying the operating mode of the voltage source mode/current source mode (as is also the case in expressing the operating mode elsewhere in this Specification), indicating the operating mode for the interval from the operating point for the voltage and current specified in that row up to the operating point indicated by the voltage and current specified in the next row. That is, the value "I" for the V/I mode in the first line indicates the operating mode for the interval from the operating point of (0, 130) for the voltage and current to the operating point for (0.2, 128). Consequently, the operating mode for the last line is left blank. As can be understood from referencing Table 1 in FIG. 10, in the operating curve 1002, the three intervals from a voltage of 0.8 V and above are assigned to the voltage source mode, and the intervals below a voltage of 0.8 V are assigned to the current source mode, with the transition point 1006 as the boundary.

It is appreciated that in the actual implantation of the device, the implementation may be such that the transition point of the operating modes is such that the transitions will have some degree of an overlap width so that there will not be an extremely unstable state immediately after passing a transition point.

Here the voltage values in current values that indicate the operating points in the individual lines in the table presented in Table 1 can be determined from the characteristics, or the like, of the device that produces the characteristics or that is subject to the emulation (which, in this case, is a solar cell).

Moreover, the voltage values and current values of the individual lines in the table presented in Table 1, as described below, may include data that is actually measured from the device that is the subject, or include data that is based on the data that is actually measured.

That is, first, the device that is the subject (in this case, a solar cell) is connected to the output terminal 130 of the voltage-current characteristic generator 100, and the voltages are swept in the voltage source mode across a specific range, or the currents are swept in the current source mode in a specific range, and the voltage values and current values sensed at this time are stored, as measured values, in the memory 114. If the measurement does not go well, due to becoming unstable, given the operating mode at this time, then the sweep is performed by switching the operating mode.

Following this, the measured values that are stored in the memory 114 are used or edited by a computer, or the like, to structure and store, in the memory 114, a table that that specifies the operating curve.

Finally, the device that is the DUT (which, in this case, is, for example, a charging/discharging controller, or the like) is connected to the output terminal 130 of the voltage-current characteristic generator 100, and the desired operating curve output is applied from the voltage-current characteristic generator 100.

As described above, when the table that is structured in the memory 114 of the voltage-current characteristic generator 100 is structured based on the results of measurement of device by the voltage-current characteristic generator 100, the creation of the table can be achieved quickly.

Figure 11:
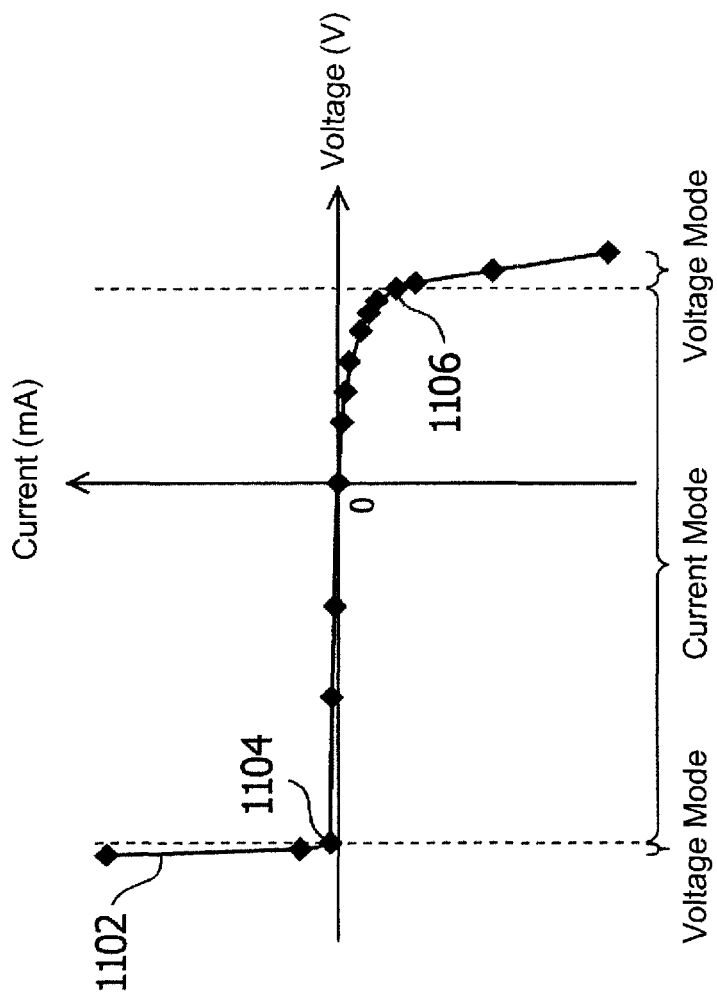
FIG. 11 is a plot of an example of a voltage-current characteristic for explaining the assignment of operating modes using the voltage-current characteristics of an LED as an example according to the present invention.

An example of a table of operating modes for the case of an operating curve for a diode, such as an LED, such as illustrated in FIG. 11, is presented in Table 2.

TABLE 2

Operating Mode for the Case of an LED

| Voltage (V) | Current (mA) | V/I Mode |
|---|---|---|
| 0.38 | −0.700 | V |
| 0.35 | −0.400 | V |
| 0.33 | −0.200 | V |
| 0.32 | −0.150 | I |
| 0.30 | −0.100 | I |
| 0.28 | −0.080 | I |
| 0.25 | −0.060 | I |
| 0.20 | −0.030 | I |
| 0.15 | −0.020 | I |
| 0.10 | −0.010 | I |
| 0.00 | 0.000 | I |
| −0.20 | 0.010 | I |
| −0.35 | 0.015 | I |
| −0.59 | 0.020 | V |
| −0.60 | 0.100 | V |
| −0.61 | 0.600 | |

As shown in Table 2 and FIG. 11, for the case of characteristics such as those of a diode, transition points for operating modes are established in two places, the point 1104 and the point 1106, where the interval between those points is assigned to the current source mode and the intervals outside of those points are assigned to the voltage source mode.

In the second current characteristics generator according to the present invention, it is possible to output stabilized DUT characteristics by switching between the voltage source and the current source through establishing two transition points, even with complex characteristics such as in FIG. 11.

Figure 12:
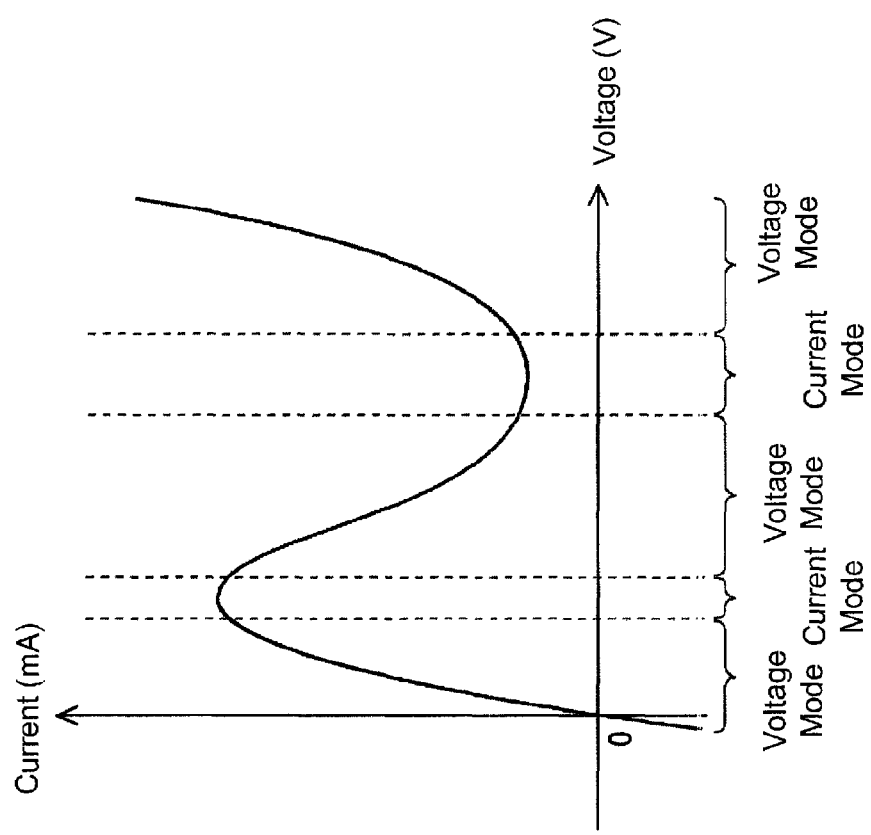
FIG. 12 is a plot of an example of a voltage-current characteristic graph for explaining the assignment of operating modes using the voltage-current characteristics of a tunnel diode as an example according to the present invention.

A case wherein an even more complex operating mode is set is shown next in FIG. 12, using, as an example, the characteristics of a tunnel diode. A table can be generated that depends on the slope of the operating curve by making a plurality of alternating assignments for the voltage source mode and the current source mode through providing a plurality of transition points in the characteristic graph in FIG. 12, that is, in the operating curve, so that intervals wherein the absolute value of the slope is small will be set to the current source mode, and intervals wherein the absolute value of the slope is large will be set to the voltage source mode.

While in the example set forth above, an example was shown wherein a table was used to assign the operating modes, it is also possible to make the assignments similarly using a program in the controller in FIG. 1. Moreover, it is possible to use a method wherein a processor is structured from an FPGA, to compile the numeric formulas and incorporate them in hardware. Moreover, a memory may be provided in the FPGA. Furthermore, the controller 110 may be structured so as to calculate the subsequent setting values based not just on the existing voltage value and electric current value, but based on internal data within the controller, in addition thereto, in order to calculate the subsequent operating point, that is, the subsequent setting value. In this case, the table may be a table that includes a column for internal data, and that expresses the voltage, electric current, and operating mode corresponding to the anticipated internal data value. Moreover, in the program the structure may be one wherein the internal data may be used as a parameter, for example, in addition to the existing voltage value and electric current value, to calculate the subsequent setting values. As an example of such, there may be a case wherein the subsequent setting values are calculated by taking into consideration the amount of electrical power consumed at that point in time, in addition to the basic operating curve, when generating or emulating the voltage discharge characteristics of a battery. In such a case, the amount of energy consumed can be calculated as internal data of the controller 110 through, for example, integrating the voltage values and electric current values up until that time.

Figure 13A:
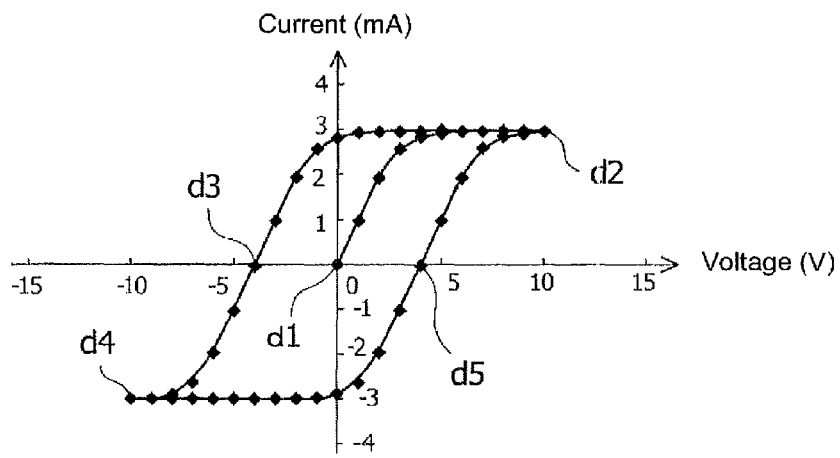
FIG. 13 A is a plot illustrating a typical example of hysteresis characteristics.
FIG. 13B is a plot illustrating the characteristics in the hysteresis characteristics basic mode.
FIG. 13C is a plot illustrating the output of a voltage value that is affected by a memory affect, based on FIG. 13B, when the voltages are applied in a time series according to the present invention.

As an example wherein more complex characteristics can be generated or emulated, it is possible to generate or emulate, and then output, the hysteresis characteristics of a magnetic body or dielectric body, or the like, as voltage-current relationships, using the voltage-current relationship generator according to the present invention. As illustrated in FIG. 13A, hysteresis characteristics exhibit characteristics that start at a point d1, arrive at a point d2 as the voltage increases, pass through a point d3 to arrive at a point d4 as the voltage decreases, and then pass through the point d5 to arrive at the point d2 as the voltage increases again. In order to generate or emulate such characteristics, a controller may be structured so as to operate as shown below through, for example, the use of a table or an equation.

First, let us assume that there are the following relationships:

$$I=f(V); \text{ and}$$

$$V=f^{-1}(I).$$

Figure 13B:
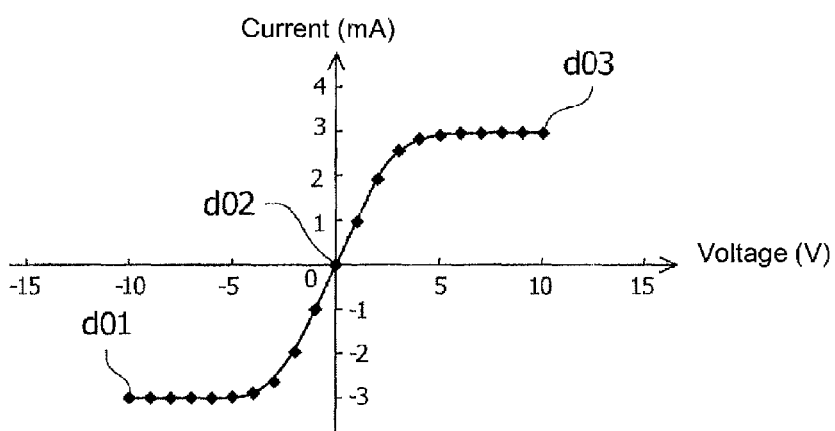

Next, the basic curve and operating modes for the case wherein there is no hysteresis, as shown in FIG. 13B, are set up, using a table, as shown in Table 3, below.

TABLE 3

Operating Modes in the Basic Curve for Hysteresis

| Voltage [V] | Current [mA] | V/I Mode | R [Ω] |
|---|---|---|---|
| −10 | −2.985 | I | 176.428 |
| −9 | −2.979 | I | 113.910 |
| −8 | −2.970 | I | 69.898 |
| −7 | −2.956 | I | 40.295 |
| −6 | −2.931 | I | 21.521 |
| −5 | −2.884 | I | 10.506 |
| −4 | −2.789 | I | 4.698 |
| −3 | −2.576 | V | 2.060 |
| −2 | −2.091 | V | 1.092 |
| −1 | −1.175 | V | 0.851 |
| 0 | 0.000 | V | 0.851 |
| 1 | 1.175 | V | 1.092 |
| 2 | 2.091 | V | 2.060 |
| 3 | 2.576 | I | 4.698 |
| 4 | 2.789 | I | 10.506 |
| 5 | 2.884 | I | 21.521 |
| 6 | 2.931 | I | 40.295 |
| 7 | 2.956 | I | 69.898 |
| 8 | 2.970 | I | 113.910 |
| 9 | 2.979 | I | 176.428 |
| 10 | 2.985 | | |

Here the fourth column is the slope, using the operating point in that row as the starting point, until the operating point of the next row, that is, the approximate resistance value R, and is given as a reference for the explanation, and it should be noted that this need not necessarily be in the table in memory. In Table 3, if the resistance value is greater than 3Ω, then the current source mode is assigned, but if the resistance value is less than 3Ω, then the voltage source mode is assigned.

Figure 13C:
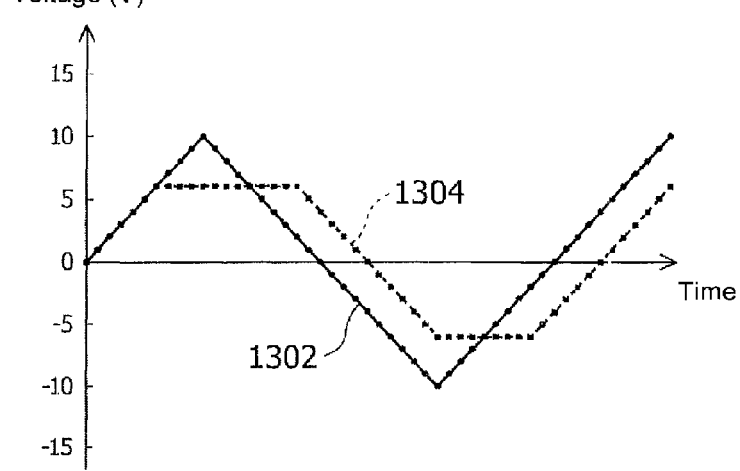

Following this, the voltage V', which takes into account the effects of hysteresis (the memory effect) is generated for the input voltage V as follows: If the voltage is increasing: A value that is affected by the immediately preceding minimum value (where a lower limit is set on the minimum value); and If the voltage is decreasing: A value that is affected by the immediately preceding maximum value (where an upper limit is set on the maximum value). FIG. 13C shows that which is calculated for V' (the dotted line 1304) in relation to V (the solid line 1302) in this way based on the characteristics in FIG. 13B.

When I=f(V') is calculated from the series of V', obtained in this way, a hysteresis curve is obtained as illustrated in FIG. 13A. The characteristics are merely shifted, in the voltage direction, and there is no change in the output resistance relative to the electric current at a given operating point. Consequently, when the internal resistance within the DUT is constant, there is also no change in the stability conditions that were established at first. However, if the internal resistance of the DUT varies depending on the operating point, then the relationship between the two is shifted, and so it can be anticipated that the operation will become unstable. In such a case, it is possible to investigate in advance the dependency of the internal resistance within the DUT on the electric current, to produce stable operation through switching the operating mode between the voltage source mode and the current source mode by comparing this to the output resistance at the operating point. This may be achieved through structuring the controller as the controller 1410 illustrated in FIG. 14.

Specifically, first, on the voltage source side, voltage and current feedback 1450 from the sensing portion 108 is inputted into a memory effect calculating unit 1414, and the $V_1'$ is outputted from an output point P1, and the electric current value $I_1$ is outputted at the output point P2 by a subsequent I=f(V) calculating unit 1416. The voltage setting for the subsequent operating point is performed by the voltage source 102 based on that electric current value. However, in relation to the electric current value that is outputted from the unit 1416, the output impedance $Z_{out}$ and the internal impedance $R_L$ of the DUT are calculated by the unit 1418 and the unit 1420, and compared by a comparing device 1422. At this time, $Z_{out} < R_L$ is the stable condition. The result is sent to an evaluating device 1444.

Moreover, when it comes to the current source side, the voltage and current feedback 1452 from the sensing portion 108 is inputted into the memory effect calculating unit 1434, an electric current $I_2'$ that takes the effect of hysteresis into account is outputted, and the voltage value $V_2$ is next outputted from a $V=f^{-1}(I)$ calculating unit 1436. The electric current setting for the subsequent operating point is performed by the current source 104 based on that voltage value. However, in relation to the voltage value that is outputted from the unit 1436, the output impedance $Z_{out}$ and the internal impedance $R_L$ of the DUT are calculated by the unit 1438 and the unit 1440, and compared by a comparing device 1442. At this time, $Z_{out} > R_L$ is the stable condition. The result is sent to an evaluating device 1444.

The evaluating device 1444 controls the selector 106 through a path, specifically, through a control line 126, so as select either the voltage source or the current source depending on the comparison result that is inputted. The result is that either the voltage source or the current source, whichever will lead to stable operation, is selected, and a signal is outputted. It is appreciated that if noise or transitional effects, or the like, become a factor so that comparison results inputted into the evaluating device 144 are contradictory, either both in an unstable state or both in a stable state, then, for example, control may be so as to select, as the more certain comparison result, the one with the smaller difference between the output impedance $Z_{out}$ and the internal impedance $R_L$ in the DUT, for example. A voltage-current characteristics generator 1400 that is provided with a controller 1410 as described above may be structured to enable generation or emulation of hysteresis characteristics.

The method set forth above similarly makes it possible to generate or emulate backlash characteristics wherein a portion of the initial change in the input does not exert an effect on the output, saturation characteristics wherein there is an upper limit or a lower limit on the output, dead zone characteristics wherein the output is zero if the input is less than a threshold value, and coulomb and viscous friction models wherein both a static model and a dynamic model are provided in parallel.

Furthermore, the use of the external parameter input 116 into the controller 110 makes it possible to achieve generation or emulation of static parameter inputs or dynamic parameter inputs. For example, it is possible to generate or emulate static or dynamic parameters such as discharge capacities, battery temperatures, number of charging cycles, and the like, in order to generate or emulate characteristics of batteries. Furthermore, device temperatures, temperatures and air pressures from sensors, and the like, are applied to the input as external parameter inputs in generating or emulating diode characteristics.

In addition, as an example of embodiment of generation or emulation of other characteristics, a time t is inputted from the external parameter input 116 into the controller 110 in order to calculate, using a processor 112, an equation that is loaded in the memory 114, to generate or emulate a transient response to a signal.

That is, because a transient phenomenon has the characteristic of being time-dependent, it can be expressed as a function that includes a time term, such as t, as in, for example, I=func(V, t). Here the application of t produces an electric current value from V in the same manner as in an equation that does not have t. For the case of an expression wherein the output resistance is also expressed as a function of voltage and time, such as, for example, Z=func2(V, t), then the information as to whether the voltage source or the current source should be selected, depending on the relationship with the internal resistance of the DUT, can be expressed in advance as a function of time, thus making it possible to structure a controller that is able to select the appropriate power supply. If necessary, it is possible to reset the time term through a measured value or from the outside. When from a measured value, it is possible to set t=0 when, for example, a threshold value is exceeded.

Furthermore, as an embodiment of generation or emulation of other characteristics as well, it is possible to generate or emulate AC characteristics or frequency characteristics of a device. That is, the LC components are added to the output resistance to form the output impedance 704 in FIG. 7A into an RLC series circuit and the output impedance 1804 in FIG. 18A into an RLC parallel circuit. Here the voltage drop in FIG. 7A can be calculated by Equation (6), below.

$$v = Ri + L\frac{di}{dt} + \frac{1}{C}\int i\,dt \qquad (6)$$

Moreover, the leakage current in FIG. 18A can be calculated by Equation (7), below.

$$i = \frac{v}{R} + \frac{1}{L}\int v\,dt + C\frac{dv}{dt} \quad (7)$$

Figure 14:
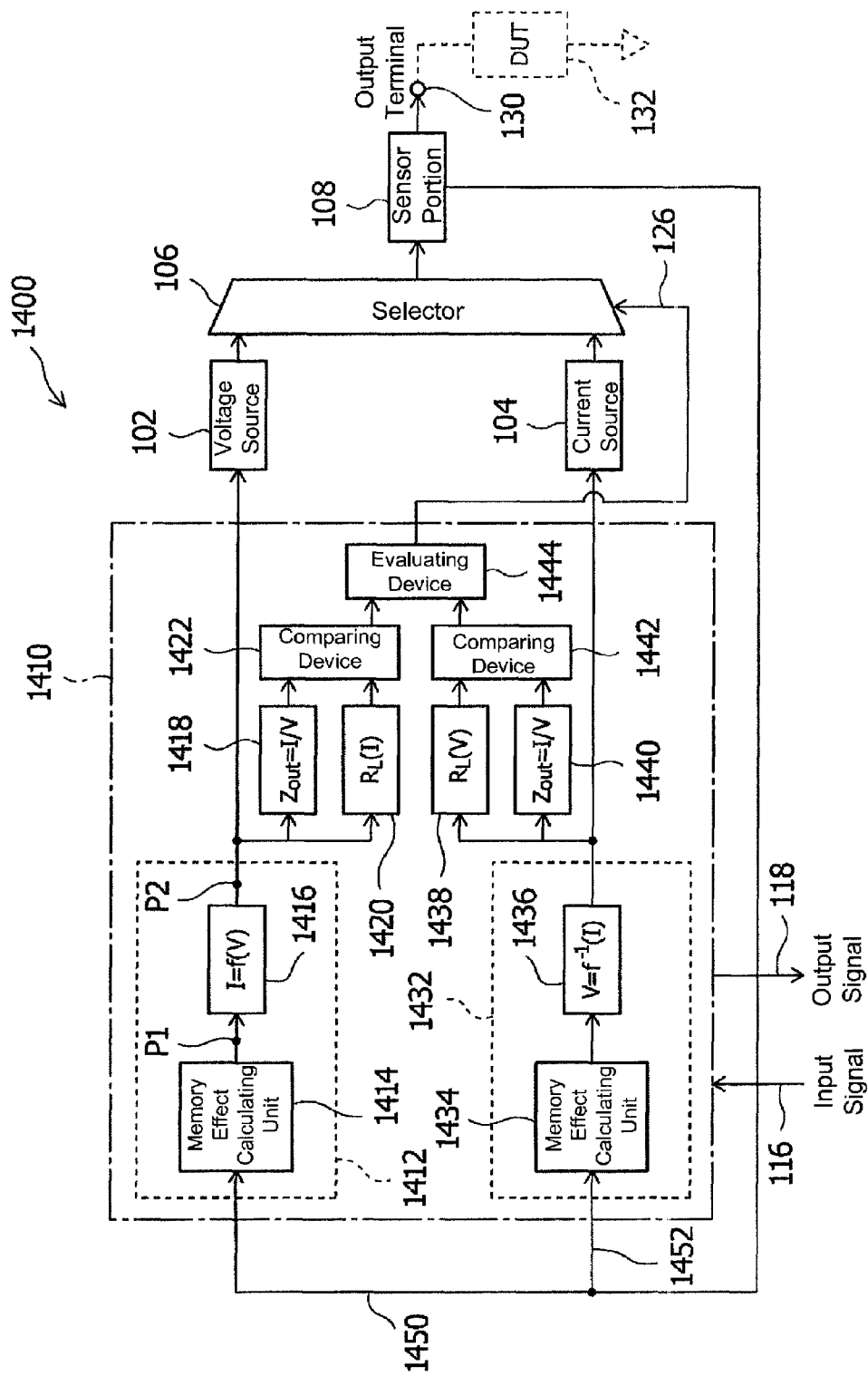
FIG. 14 is a block diagram illustrating an example of an implementation of a structure of a controller for achieving the hysteresis characteristics of FIG. 13A based on the block diagram in FIG. 1, according to the present invention.

Consequently, a controller can be structured for generating or emulating AC characteristics by receiving the time t, from the external parameter input, through the provision of a unit that operates as a mathematical function, through inputting the voltage v and time t, and a unit that operates as a mathematical function through inputting the current i and the time t, instead of the units 1412 and 1432 in FIG. 14, to respond with the R, L, and C non-linearly.

Conversely, the use of the frequency ω makes it possible to calculate, through the respective Equation (8) and Equation (9), below, the voltage drop in FIG. 7A and the leakage current in FIG. 18A.

$$v = \left(R + \omega L + \frac{1}{\omega C}\right)i \quad (8)$$

$$i = \left(\frac{1}{R} + \frac{1}{\omega L} + \omega C\right)v \quad (9)$$

Consequently, a controller can be structured for generating or emulating AC characteristics by receiving the frequency ω, from the external parameter input, through the provision of a unit that operates as a mathematical function, through inputting the voltage v and frequency ω, and a unit that operates as a mathematical function through inputting the current i and the frequency ω, instead of the units 1412 and 1432 in FIG. 14, to respond with the R, L, and C non-linearly.

As yet another embodiment of generation or emulation of other characteristics, the generation or emulation of characteristics of a device of three or more terminals can be achieved through the use of a plurality of channels of voltage-current characteristic generators according to the present invention.

Figure 15A:
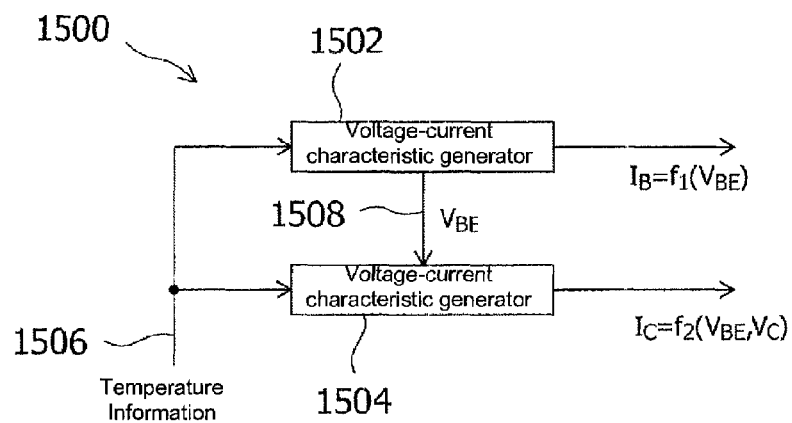
FIG. 15A is a block diagram of an example of an implementation of a circuit for a device that uses a plurality of voltage-current characteristic generators when achieving a transistor characteristic output according to the present invention.
Figure 15B:
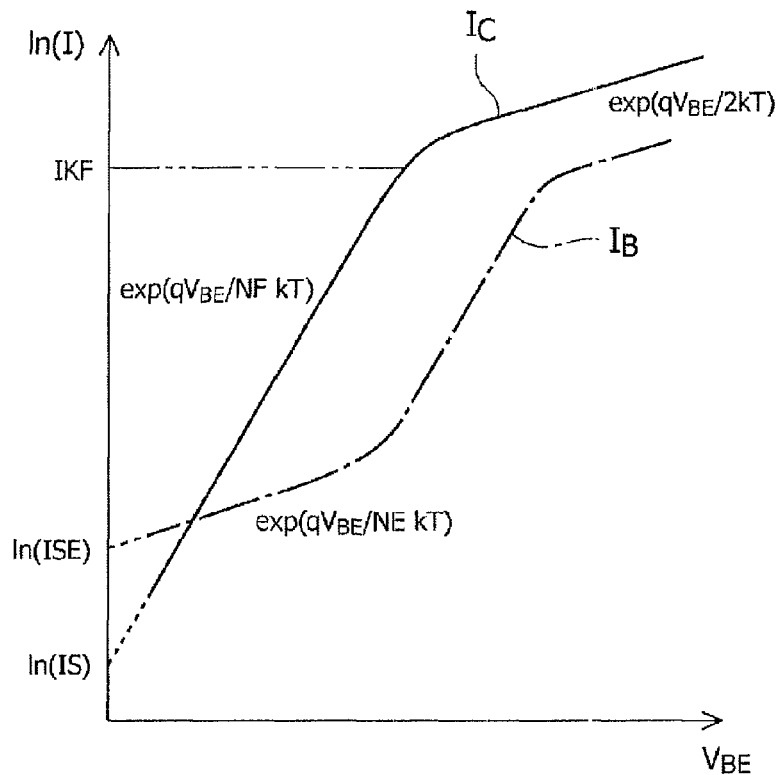
FIG. 15B is a plot showing the characteristics that are produced by the device in FIG. 15A according to the present invention.

In the circuit 1500, illustrated in FIG. 15A, temperature information can be applied, as a portion of the external parameter inputs, into two channels of voltage-current characteristic generators 1502 and 1504, and base-emitter voltage $V_{BE}$ information 1508, outputted from the output terminal of the voltage-current characteristic generator 1502 can be inputted as a portion of the external parameter inputs for the voltage-current characteristic generator 1504, to enable outputting of the base-emitter current $I_B$ and the collector-emitter current $I_C$ as characteristics such as shown up in FIG. 15B, wherein the vertical axis is a logarithmic indicator ln(I) of the current.

Here the voltage-current characteristic generator 1504 generates or emulates the voltage-current characteristics of the collector-emulator using, for example, a table, but, at this time, it is possible to structure so as to include, in that table, also columns corresponding to base-emitter voltage information and temperature information that are inputted from the external parameter inputs, so as to determine the electric current value by taking into account the base-emitter voltage and temperature, approximated through linear interpolation, or the like, therefrom. Conversely, when a program is used, it is possible to structure the program so as to determine the voltage-current characteristics of the collector-emitter by taking into account the base-emitter voltage characteristics and temperature, inputted from the external parameter inputs.

Furthermore, the voltage-current characteristic generator 100, illustrated in FIG. 1, may be structured so that, in the controller 110, the resistance $R_L$ of the DUT is measured at an operating point, and a magnitude comparison is made between the value of the output resistance $Z_{out}$, calculated as the tangent to the operating curve at that operating point, and the value of the resistance $R_L$ of the DUT that has been measured, to automatically evaluate the operating mode for the next operating point. In this case, the controller 110 observes the variations in the voltage and electric current values from the sensor portion 108, relative to the voltage and current output at the present operating point, to measure the internal resistance value of the DUT, that is, the resistance value of DUT, from that variation, to estimate the internal resistance value of the DUT at the subsequent operating point. Conversely, the controller 110 may, for example, superimpose a signal including a minute AC component from the voltage source 102 or the current source 104 (for example, an AC repeating signal, a single-pulse waveform signal, or a single-pulse ramped signal) on the output at the current operating point, to measure the DUT resistance value through measuring the variation at the sensing portion in response to the AC component.

Figure 8:
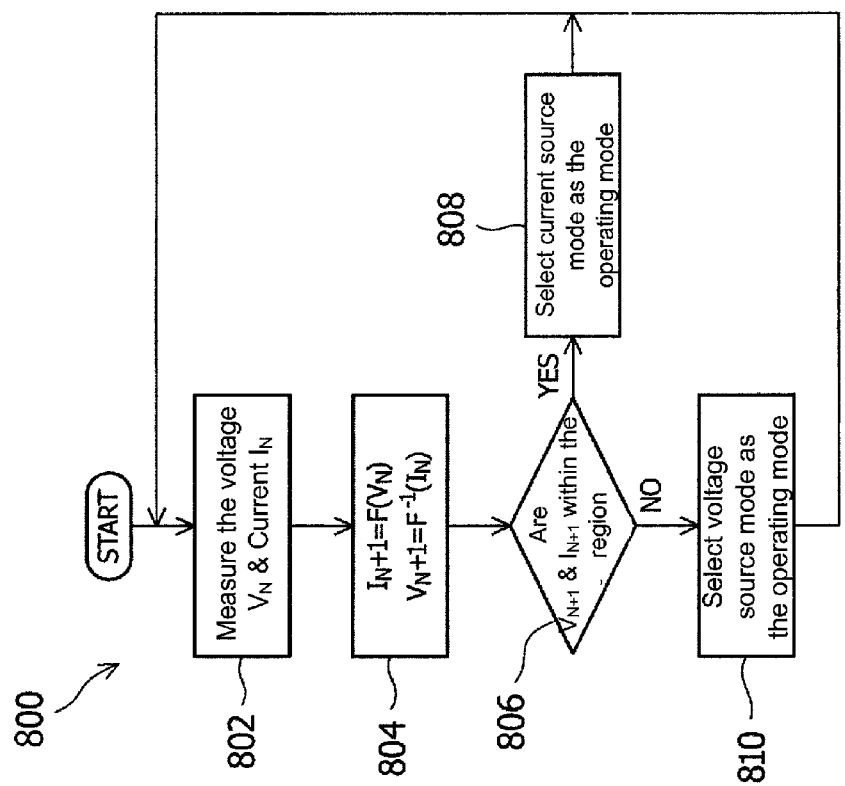
FIG. 8 is a flowchart illustrating the operation of the controller in FIG. 1 according to the present invention.
Figure 9:
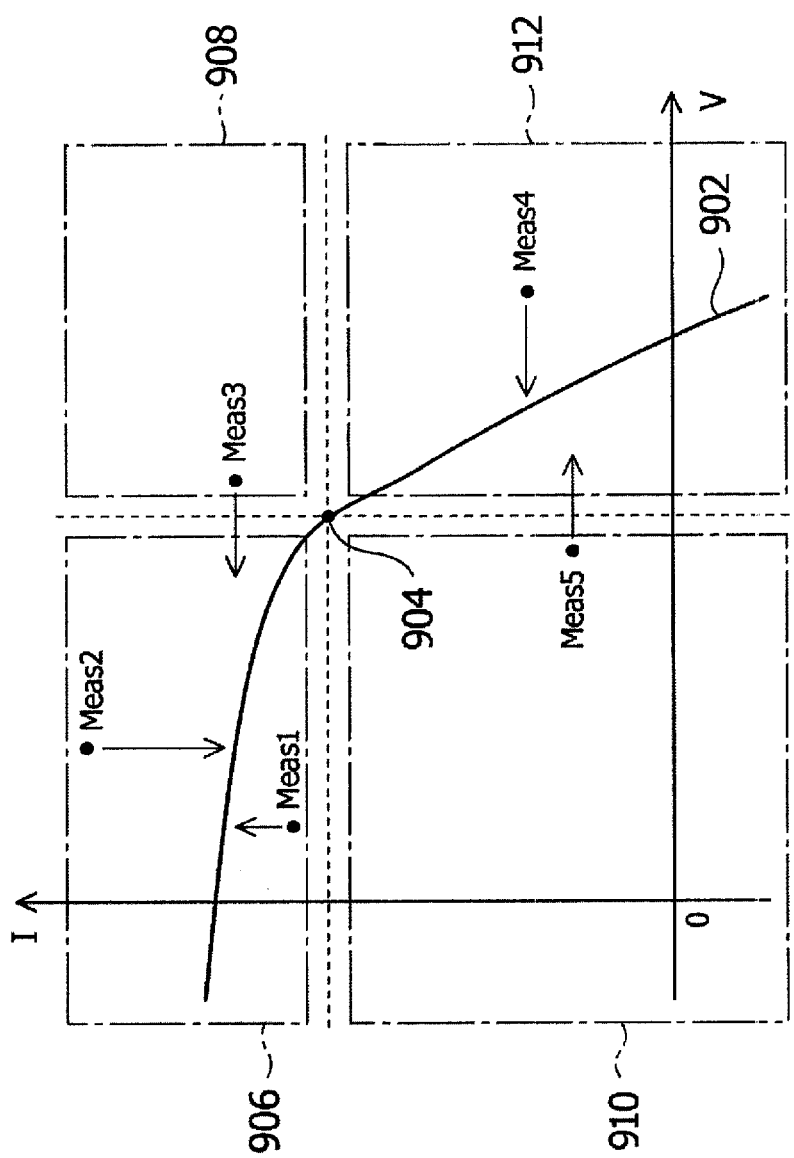
FIG. 9 is a plot of an example of a voltage-current characteristic for explaining the operation in the flow chart in FIG. 8 using the characteristics of a battery as an example according to the present invention.

In this case, it is not necessary to provide a column specifying the operating mode in the table in the memory 114, nor in the operating algorithm of the controller 110 either, and rather than adding, to the measurement of the voltage and electric current in Step 802 in FIG. 8, the output resistance at the present operating point and including a calculation of the internal resistance of the DUT from the amplitude of the voltage and electric current values that have been measured, to evaluate the region in Step 806, instead it is possible to switch the reading by advancing to either Step 808 or Step 810 depending on the YES/NO evaluation result by evaluating whether or not the output resistance is greater than the internal resistance of the DUT.

As described above, the first embodiment, illustrated in FIG. 1, enables generation or emulation of a variety of DUT characteristics through a structure wherein either the voltage source 102 or the current source 104 is selected by the selector 106.

Figure 2:
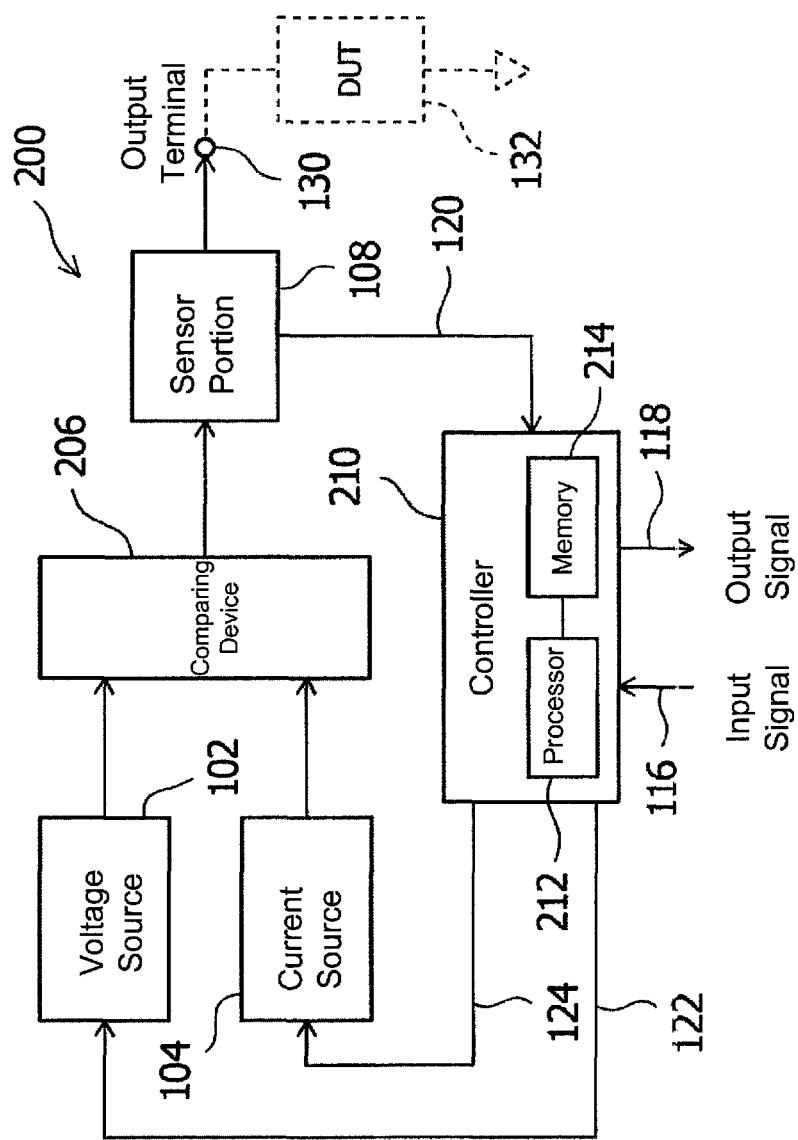
FIG. 2 is a block diagram an example of an implementation of a voltage-current characteristic generator according to the present invention.

While various types of applications have been explained above for the first embodiment, illustrated in FIG. 1, the applications above can be embodied similarly in the second embodiment, illustrated in FIG. 2. Here the voltage-current characteristic generator 200 of FIG. 2 has identical codes assigned to those parts that are the same as in FIG. 1 (both here and below). The voltage-current characteristic generator 200 of FIG. 2, when compared to FIG. 1, has the same structure as in FIG. 1 with the exception of the outputs of the voltage source 102 and the current source 104 not being connected to the comparing device 206 and the control line from the controller 210 is not connected to the comparing device 206, and the point wherein there is no need for the processor 212 and the memory 214 within the controller 210 to send control to the comparing device 206.

The comparing device 206 compares the signals from the voltage source 102 and the current source 104, and, as one example, outputs whichever one has the highest voltage value. That is, this example envisions the generation or emulation of characteristics of a device in the direction wherein the voltage value is increasing.

Moreover, once the operating mode for the subsequent operating point has been determined, the controller 210 performs control in accordance with the mode value so as to cause the setting value for either the voltage source 102 or the current source 104, whichever is not indicated by the operating mode, to go to 0 (zero), or the inactive value.

Note that, depending on the purpose for the characteristics that are being generated or emulated, the form may be one wherein the one that was smaller in the comparison evaluation is outputted, or one wherein the signals that are subject to the comparison are the electric currents.

As described above, in the second embodiment, illustrated in FIG. 2, the structure wherein the signal from the voltage source 102 or the current source 104 is selected by a comparison by the comparing device 206 enables the generation or emulation of the characteristics of a variety of DUTs without the comparing device 206 being controlled by the controller.

Figure 3:
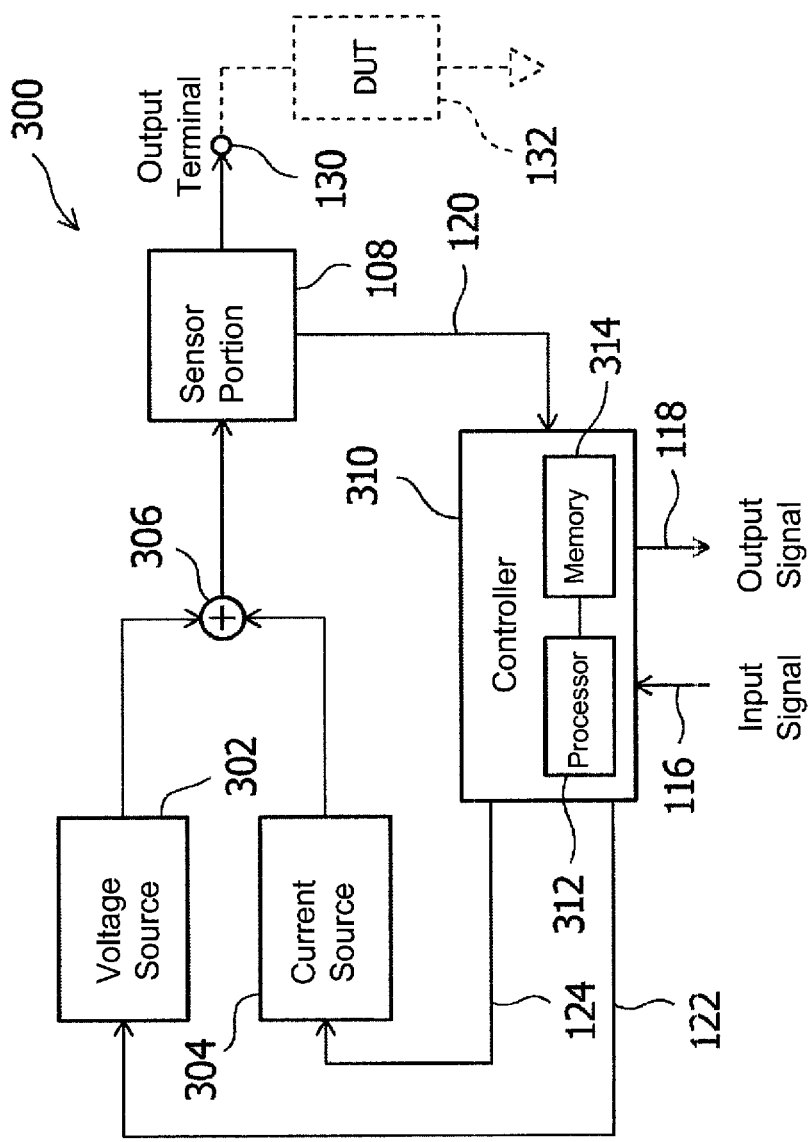
FIG. 3 is a block diagram an example of an implementation of a voltage-current characteristic generator according to the present invention.

The applications described above can be embodied similarly in a third embodiment, illustrated in FIG. 3, as yet another embodiment. Here the voltage-current characteristic generator 300 of FIG. 3, when compared to that of FIG. 2, is structured the same as that in FIG. 2 aside from the differences from FIG. 2 in the point that the outputs of the voltage source 302 and the current source 304 are not connected to the adding device 306 and the control line from the controller 310 is not connected to the adding device 306, and the point that the processor 312 and the memory 314 within the controller 310 perform control taking into account that the outputs from the voltage source 302 and the current source 304 are added by the adding device 306.

The adding device 306 adds together and outputs the signals from the voltage source 302 and the current source 304. It is possible, for that purpose, to perform voltage-current conversion so as to enable the voltage source 302 and the current source 304 to be applied to the addition.

Moreover, the adding device 306 may be a simple connection node that is able to produce the addition result.

The controller 310 may be structured so that, once the operating mode for the subsequent operating point has been determined, control may be performed so as to weight to 0 (zero) the setting value for the voltage source 102 or the current source 104, whichever has not been indicated by the operating mode, or to perform other weighting control so as to not require a reconversion of the output from the adding device 306.

As described above, in the third embodiment, illustrated in FIG. 3, the structure wherein the signals outputted from the voltage source 302 and the current source 304 are added by the adding device 306 and outputted enables emulation or emulation of characteristics of a variety of DUTs, without the adding device 306 being controlled by the controller 310.

Figure 4:
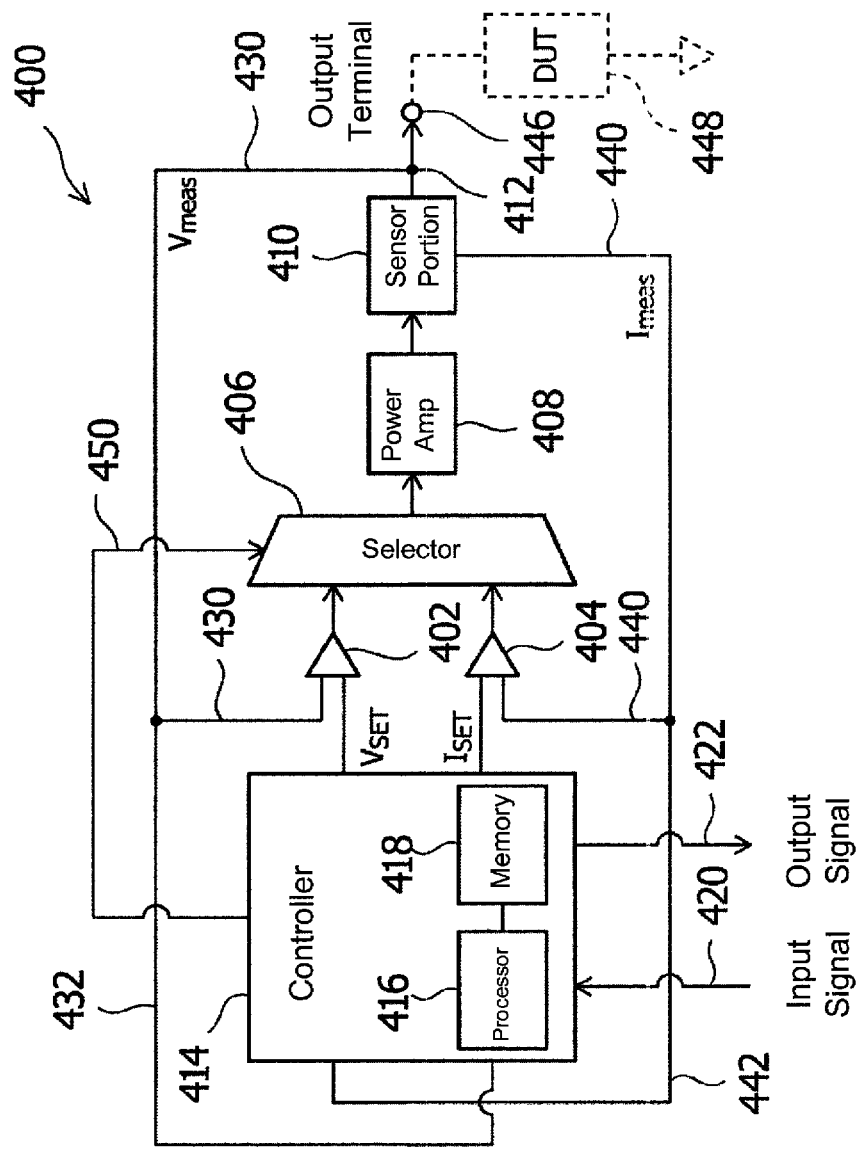
FIG. 4 is a block diagram an example of an implementation of a voltage-current characteristic generator according to the present invention.

The applications set forth above can be embodied similarly in a fourth embodiment, illustrated in FIG. 4, as yet another embodiment. Here, when compared to FIG. 1, in the voltage-current characteristic generator 400 in FIG. 4, the voltage source 102 is structured from an error amplifier 402, and the current source 104 is structured from an error amplifier 404, and a selector 406 selects and outputs one of the outputs from the error amplifiers 402 and 404 in accordance with a signal line 450 from the controller 414. The output from the selector 406 is amplified by a power amplifier 408 and outputted through a current sensing portion 410 and a voltage sensing point 412. Here the current sensing portion 410 detects an electric current value Imeas, and is connected through a path 440 to the error amplifier 404, to feedback the electric current value that has been detected. The electric current sensing portion 410 is structured from, for example, an electric current detecting resistance, and may be structured so that the voltage difference across the electric current detecting resistance is outputted as the $I_{meas}$ signal by an error amplifier. The voltage sensing point 412 is connected to the error amplifier 402 through a path 430, to feedback a voltage $V_{meas}$.

The controller 414 receives the $V_{meas}$ through a path 432 that branches from the path 430, and receives $I_{meas}$ through a path 442 that branches from the path 440, and performs the same operation as in the algorithm 800 in FIG. 8, to output a setting voltage $V_{SET}$ to the voltage source error amplifier 402 or to output a setting voltage $I_{SET}$ to the current source error amplifier 404.

Here the controller 414 outputs the setting voltage $V_{SET}$ using the current feedback from the path 442 to prevent a voltage drop due to the output resistance, and outputs the current setting value $I_{SET}$ using the voltage feedback from the path of 442, to prevent a leakage current due to the output resistance.

Moreover, the controller 414 is provided with an external parameter input 420 and an external output 422, in the same manner as in FIG. 1, where the operations thereof are also the same as explained for the first embodiment in FIG. 1.

The controller 414 is provided with a processor 416 and a memory 418 that is connected to said processor, which operate in the same manner as the processor 112 and the memory 114 in FIG. 1.

It should be understood that the structure of the voltage-current characteristic generator 400 can embody the various applications explained in regards to FIG. 1.

As described above, in the fourth embodiment, illustrated in FIG. 4, the structure wherein either the voltage source error amplifier 402 or the current source error amplifier 404 is selected by the selector 406 enables generation or emulation of characteristics of various types of DUTs.

Figure 5:
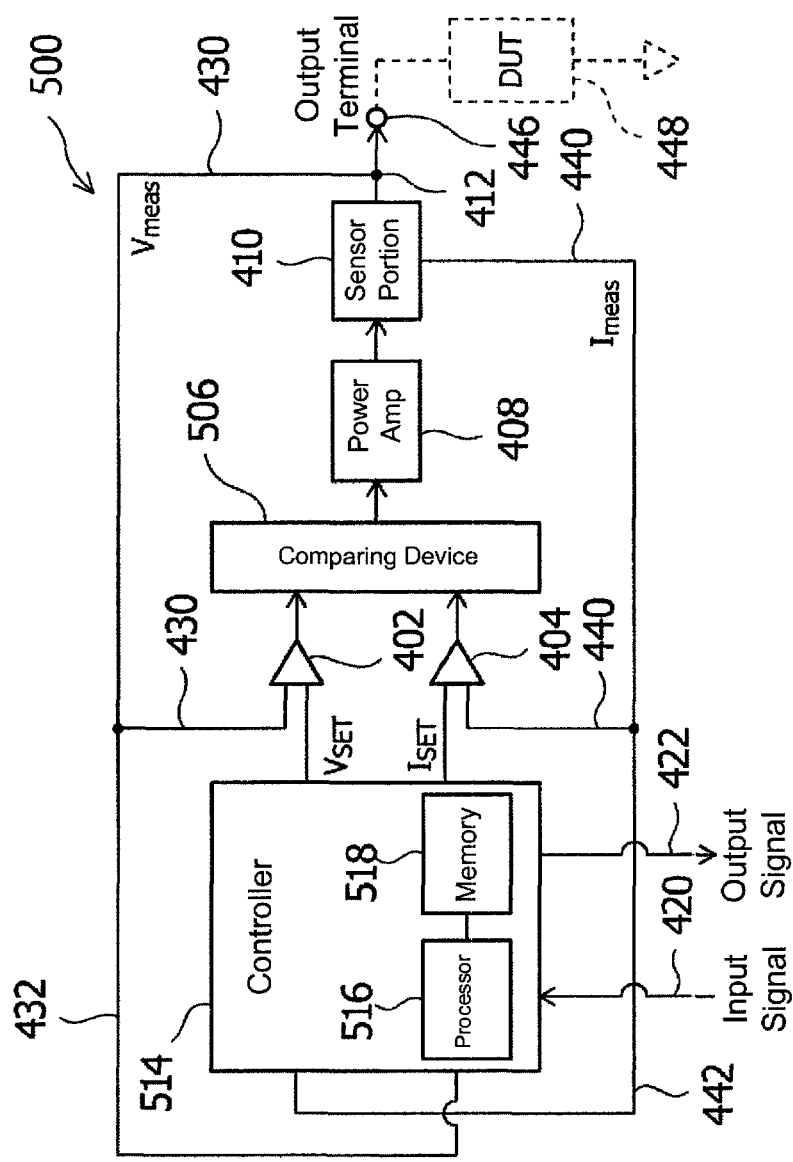
FIG. 5 is a block diagram an example of an implementation of a voltage-current characteristic generator according to the present invention.

The applications set forth above can be embodied similarly in a fifth embodiment, illustrated in FIG. 5, as yet another embodiment. When compared to FIG. 4, in the voltage-current characteristic generator 500 in FIG. 5, instead of the selector 406, a comparing device 506 selects, and outputs to the power amp 408, whichever signal is larger from the error amplifiers 402 and 404, and the controller 514 does not provide an output for controlling a comparing device. Because of this, the processor 516 and the memory 518 within the controller 514 differ from FIG. 4 in the point that the output to the comparing device is not provided.

Moreover, in the same manner as in FIG. 2, once the operating mode for the subsequent operating point has been determined, the controller 514 performs control in accordance with the mode value so as to cause the setting value for either the voltage source error amplifier 402 or the current source error amplifier 404, whichever is not indicated by the operating mode, to output a 0 (zero) or a value so as to be an inactive value.

As described above, in the fifth embodiment, illustrated in FIG. 5, the structure wherein the signals from the voltage source error amplifier 402 and the current source error amplifier 404 are compared and selected by the comparing device 506 makes it possible to generate or emulate characteristics of a variety of DUTs without the comparing device 506 being controlled by the controller 514.

Figure 6:
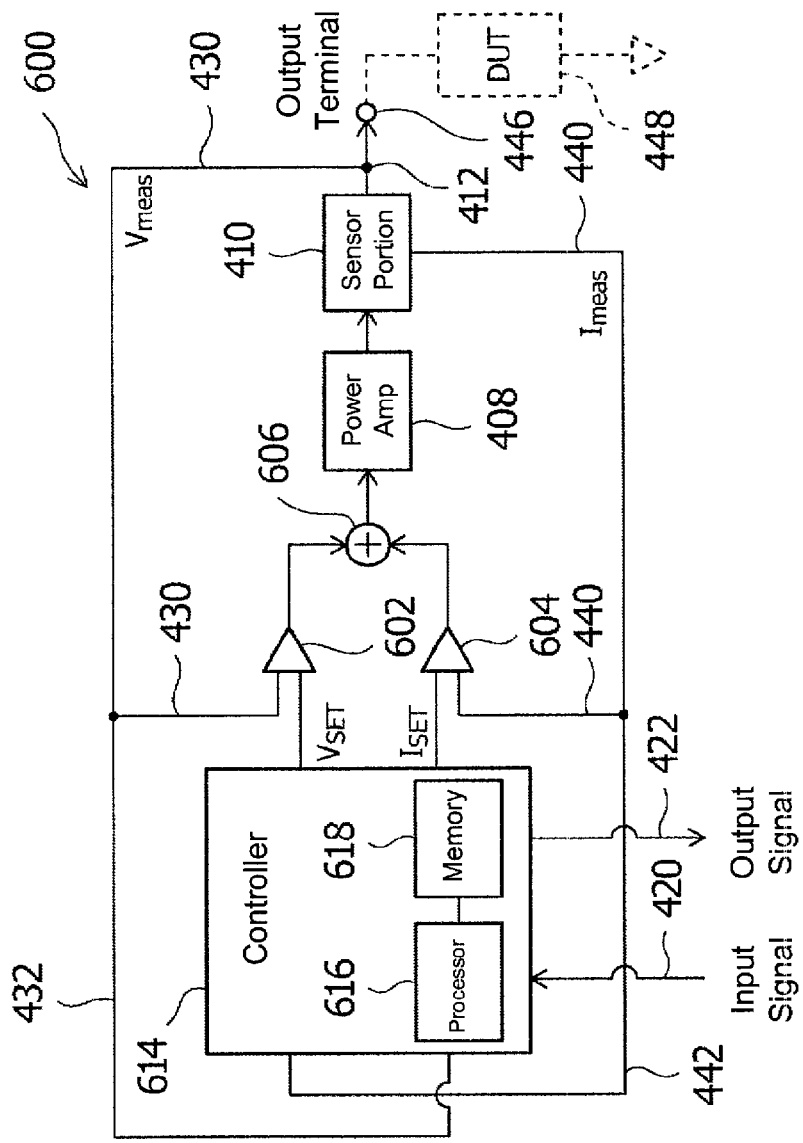
FIG. 6 is a block diagram an example of an implementation of a voltage-current characteristic generator according to the present invention.

The applications set forth above can be embodied similarly in a sixth embodiment, illustrated in FIG. 6, as yet another embodiment. Here, when compared to FIG. 5, in the voltage-current characteristic generator 500 of FIG. 6, the adding device 606 adds the signals from the error amplifiers 602 and 604 and outputs the result to the power amplifier 408, and the controller 614 does not provide an output for controlling the adding device.

The adding device 606 adds and outputs the signals from the voltage source error amplifier 602 and the current source error amplifier 604. It is possible, for that purpose, to perform voltage-current conversion so as to enable the error amplifiers 602 and 604 to be applied to the addition.

Moreover, the adding device 606 may be a simple connection node that is able to produce the addition result.

The controller 614 may be structured so that, once the operating mode for the subsequent operating point has been determined, control may be performed so as to weight to 0 (zero) the setting value for the voltage source error amplifier 602 or the current source error amplifier 604, whichever has not been indicated by the operating mode, or to perform other weighting control so as to not require a reconversion of the output from the adding device 606.

As described above, in the sixth embodiment, illustrated in FIG. 6, the structure wherein the signals outputted from the voltage source error amplifier 602 and the current source 604 error amplifier are added by the adding device 606 and outputted enables emulation or emulation of characteristics of a variety of DUTs, without the adding device 606 being controlled by the controller 614.

Although the previous description only illustrates particular examples of various implementations, the invention is not limited to the foregoing illustrative examples. A person skilled in the art is aware that the invention as defined by the appended claims can be applied in various further implementations and modifications. In particular, a combination of the various features of the described implementations is possible, as far as these features are not in contradiction with each other. Accordingly, the foregoing description of implementations has been presented for purposes of illustration and description. It is not exhaustive and does not limit the claimed inventions to the precise form disclosed. Modifications and variations are possible in light of the above description or may be acquired from practicing the invention. The claims and their equivalents define the scope of the invention.

What is claimed is:

1. A voltage-current characteristic generator comprising:
a voltage source;
a current source;
a selector for selecting and outputting an output of each of the voltage source and the current source;
a sensor, connected to an output of the selector, for outputting the output of the selector and for sensing, and feeding back, voltage and current of the selector output; and
a controller for receiving the voltage and current sensed by the sensor and for setting subsequent outputs in the voltage source and the current source, wherein, in addition to setting the subsequent outputs, the controller evaluates an operating mode among two operating modes and instructs the selector to subsequently select and output the output of either the voltage source or the current source in accordance with the evaluated operating mode, wherein the two operating modes comprise a voltage source mode and a current source mode.

2. The voltage-current characteristic generator of claim 1, wherein:
the controller further comprises an external parameter input and an external output, and
the selector receives, from the controller, a control signal for selecting either the voltage source or the current source.

3. The voltage-current characteristic generator of claim 2, wherein:
the selector is a comparing device or an adding device,
the controller controls a setting of either the voltage source or the current source depending on the result of the evaluation of the operating mode, and
the controller is able to generate an output that is swept in either of the two operating modes.

4. The voltage-current characteristic generator of claim 3, wherein:
the controller is provided with data or a program for specifying the evaluated operating mode for a plurality of output settings, for evaluating the operating mode for the setting of the subsequent outputs, and
the controller includes a processor and a memory.

5. The voltage-current characteristic generator of claim 4, wherein:
the data or program comprises data or a program for specifying the evaluated operating mode based on the external parameter input in addition to the plurality of output settings, and
the data includes data based on a measurement result by the voltage-current characteristic generator.

6. The voltage-current characteristic generator of claim 5, wherein:
the controller is structured so as to measure a present voltage and electric current, to calculate a subsequent voltage and electric current, to evaluate, from the subsequent voltage and electric current, an operating mode among the two operating modes to be selected, and to control to that selected operating mode, and
the controller, when calculating the subsequent voltage and electric current, further receives an input from an external input parameter input and performs a calculation.

7. The voltage-current characteristic generator of claim 6, wherein the controller is structured so as to calculate a resistance value of a device under test (DUT) that is connected to the voltage-current generator, from a variation in the measured values for the present voltage and electric current, to compare with an output resistance value at the present voltage and current, calculated from the output settings, to evaluate the operating mode among the two operating modes to be selected, based on the subsequent voltage and electric current, and to control to the selected operating mode.

8. The voltage-current characteristic generator of claim 7, wherein the operating mode evaluation by the controller selects a voltage supply mode if the output resistance value is greater than the resistance value of the DUT, and selects a current supply mode otherwise.

9. The voltage-current characteristic generator of claim 8, wherein:
the controller includes, in subsequent output settings, a plurality of settings wherein a signal that includes an alternating current (AC) component is superimposed,
the controller is configured to generate hysteresis characteristics, backlash characteristics, Gunn diode characteristics, saturation characteristics, dead zone characteristics, or Coulomb friction or viscous friction model characteristics, and
the controller is provided with a memory effect unit for calculating memory effect characteristics based on basic characteristics, in order to generate any of said characteristics.

10. The voltage-current characteristic generator of claim 9, wherein the controller is configured to generate either a transient response or AC characteristics.

11. A voltage-current characteristic generator comprising:
a first error amplifier;
a second error amplifier;
a selector for selecting and outputting an output of each of the first error amplifier and the second error amplifier exclusive of the other;
a power amplifier, connected to the output of the selector, for amplifying a signal;
a current sensor for outputting an output of the power amplifier and for sensing, and feeding back to the second error amplifier, current of the power amplifier output;
a voltage sensor for outputting an output of the current sensor and for sensing, and feeding back to the first error amplifier, voltage of the current sensor output; and
a controller for receiving the feedback from the current sensor and feedback from the voltage sensor, and for outputting settings for subsequent outputs in the first error amplifier and the second error amplifier, wherein, in addition to setting the subsequent outputs, the controller evaluates an operating mode among two operating modes and instructs the selector to subsequently select and output the output of either the first error amplifier or the second error amplifier in accordance with the evaluated operating mode.

12. The voltage-current characteristic generator of claim 11, wherein:
the controller further comprises an external parameter input and an external output, and
the selector receives, from the controller, a control signal for selecting either the first error amplifier or the second error amplifier.

13. The voltage-current characteristic generator of claim 12, wherein:
the selector is a comparing device or an adding device,
the controller controls a setting of either the first error amplifier or the second error amplifier depending on the result of the evaluation of the operating mode, and
the controller is able to generate an output that is swept in either of the two operating modes.

14. The voltage-current characteristic generator of claim 13, wherein:
the controller is provided with data or a program for specifying the evaluated operating mode for a plurality of output settings, for evaluating the operating mode for the setting of the subsequent outputs, and
the controller includes a processor and a memory.

15. The voltage-current characteristic generator of claim 14, wherein:
the data or program comprises data or a program for specifying the evaluated operating mode based on the external parameter input in addition to the plurality of output settings, and
the data includes data based on a measurement result by the voltage-current characteristic generator.

16. The voltage-current characteristic generator of claim 15, wherein:
the controller is structured so as to measure a present voltage and electric current, to calculate a subsequent voltage and electric current, to evaluate, from the subsequent voltage and electric current, an operating mode among the two operating modes to be selected, and to control to that selected operating mode, and
the controller, when calculating the subsequent voltage and electric current, further receives an input from an external input parameter input and performs a calculation.

17. The voltage-current characteristic generator of claim 16, wherein the controller is structured so as calculate a resistance value of a device under test (DUT) that is connected to the voltage-current generator, from a variation in the measured values for the present voltage and electric current, to compare with an output resistance value at the present voltage and current, calculated from the output settings, to evaluate the operating mode among the two operating modes to be selected, based on the subsequent voltage and electric current, and to control to the selected operating mode.

18. The voltage-current characteristic generator of claim 17, wherein the operating mode evaluation by the controller selects a voltage supply mode if the output resistance value is greater than the resistance value of the DUT, and selects a current supply mode otherwise.

19. The voltage-current characteristic generator of claim 18, wherein:
the controller includes, in subsequent output settings, a plurality of settings wherein a signal that includes an alternating current (AC) component is superimposed, and
the controller is configured to generate hysteresis characteristics, backlash characteristics, Gunn diode characteristics, saturation characteristics, dead zone characteristics, or Coulomb friction or viscous friction model characteristics, and
the controller is provided with a memory effect unit for calculating memory effect characteristics based on basic characteristics, in order to generate any of said characteristics.

20. The voltage-current characteristic generator of claim 19, wherein the controller is configured to generate either a transient response or AC characteristics.

* * * * *